(12) United States Patent
Kim et al.

(10) Patent No.: US 12,068,033 B2
(45) Date of Patent: Aug. 20, 2024

(54) MEMORY DEVICE AND METHOD OF OPERATING THE MEMORY DEVICE INCLUDING DETRAPPING OPERATIONS DURING PROGRAMMING

(71) Applicant: SK hynix Inc., Icheon-si (KR)

(72) Inventors: Jae Woong Kim, Icheon-si (KR); Shin Won Seo, Icheon-si (KR); Dong Jae Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 140 days.

(21) Appl. No.: 17/870,570

(22) Filed: Jul. 21, 2022

(65) Prior Publication Data
US 2023/0253050 A1 Aug. 10, 2023

(30) Foreign Application Priority Data
Feb. 10, 2022 (KR) .................... 10-2022-0017797

(51) Int. Cl.
*G11C 16/10* (2006.01)
*G11C 16/04* (2006.01)
*G11C 16/34* (2006.01)

(52) U.S. Cl.
CPC ........ *G11C 16/102* (2013.01); *G11C 16/0433* (2013.01); *G11C 16/3404* (2013.01); *G11C 16/3459* (2013.01)

(58) Field of Classification Search
None
See application file for complete search history.

(56) References Cited

U.S. PATENT DOCUMENTS

| | | | | |
|---|---|---|---|---|
| 2008/0291737 | A1* | 11/2008 | Moon ................ | G11C 16/3404 365/185.29 |
| 2012/0044771 | A1* | 2/2012 | Joo ..................... | G11C 16/3459 365/185.22 |
| 2012/0275223 | A1* | 11/2012 | Baek .................. | G11C 16/0483 365/185.11 |
| 2016/0372185 | A1* | 12/2016 | Shim .................. | G11C 16/0483 |
| 2021/0064285 | A1* | 3/2021 | Ji ......................... | G06F 3/0659 |
| 2022/0199175 | A1* | 6/2022 | Lu ...................... | G11C 16/3459 |
| 2023/0154541 | A1* | 5/2023 | Yuan ................... | G11C 11/5635 365/185.29 |

FOREIGN PATENT DOCUMENTS

KR 1020160150501 A 12/2016
KR 1020210028517 A 3/2021

* cited by examiner

*Primary Examiner* — J. H. Hur
(74) *Attorney, Agent, or Firm* — WILLIAM PARK & ASSOCIATES LTD.

(57) ABSTRACT

Provided herein is a memory device that may include a plurality of memory cells coupled to a plurality of bit lines and a common source line. The memory device may also include a control circuit configured to control a peripheral circuit to perform a program operation that includes two or more program steps on selected memory cells of a selected word line. The peripheral circuit may be configured to perform a first program step of the two or more program steps on the selected memory cells, then perform a detrap operation that applies a detrap voltage to the plurality of bit lines and the common source line for a predefined time, and thereafter perform a second program step of the two or more program steps on the selected memory cells.

20 Claims, 27 Drawing Sheets

MEMORY DEVICE AND METHOD OF OPERATING THE MEMORY DEVICE INCLUDING DETRAPPING OPERATIONS DURING PROGRAMMING

CROSS-REFERENCE TO RELATED APPLICATION

The present application claims priority under 35 U.S.C. § 119(a) to Korean patent application number 10-2022-0017797, filed on Feb. 10, 2022, in the Korean Intellectual Property Office, the entire disclosure of which is incorporated herein by reference.

BACKGROUND

1. Technical Field

Various embodiments of the present disclosure generally relate to an electronic device, and more particularly to a memory device and a method of operating the memory device.

2. Related Art

A storage device is a device that stores data under the control of a host device such as a computer or a smartphone. The storage device may include a memory device in which data is stored and a memory controller that controls the memory device. A memory device is classified as a volatile memory device or a nonvolatile memory device.

A volatile memory device is a memory device in which data is stored only when power is supplied and in which stored data is lost when the supply of power is interrupted. Examples of a volatile memory device include a static random access memory (SRAM) and a dynamic random access memory (DRAM).

A nonvolatile memory device is a memory device in which stored data is retained even when the supply of power is interrupted. Examples of a nonvolatile memory device include a read only memory (ROM), a programmable ROM (PROM), an electrically programmable ROM (EPROM), an electrically erasable and programmable ROM (EEPROM), and a flash memory.

SUMMARY

An embodiment of the present disclosure may provide for a memory device that may include a plurality of memory cells coupled to a plurality of bit lines and a common source line. The memory device may also include a control circuit configured to control a peripheral circuit to perform a program operation that includes two or more program steps on selected memory cells of a selected word line. The peripheral circuit may be configured to perform a first program step of the two or more program steps on the selected memory cells, then perform a detrap operation that applies a detrap voltage to the plurality of bit lines and the common source line for a predefined time, and thereafter perform a second program step of the two or more program steps on the selected memory cells.

An embodiment of the present disclosure may provide for a memory device that may include a plurality of memory cells coupled to a plurality of word lines, where each word line may include a plurality of pages. The plurality of memory cells may be coupled to a plurality of bit lines and a common source line. The memory device may also include a control circuit configured to control a peripheral circuit to perform a program operation of two or more program steps on a page selected from among the plurality of pages. The peripheral circuit may be configured to perform a first program step of the two or more program steps. The peripheral circuit may be configured to perform a detrap operation that applies a detrap voltage to the plurality of bit lines and the common source line for a predefined time. The peripheral circuit may be configured to thereafter perform a second program step of the two or more program steps on the selected page.

An embodiment of the present disclosure may provide for a method of operating a memory device, where the memory device may include a plurality of memory cells coupled to a plurality of word lines and coupled between a plurality of bit lines and a common source line. The method may include performing a first program step on selected memory cells coupled to a corresponding word line selected from among the plurality of word lines. The method may also include, after the first program step has been completed, performing a detrap operation of applying a detrap voltage to the plurality of bit lines and the common source line for a predefined time, where the detrap voltage may be used to detrap at least one electron trapped in the selected memory cells. The method may further include, after the detrap operation has been completed, performing a second program step on the selected memory cells.

DETAILED DESCRIPTION

Specific structural or functional descriptions in the present disclosure are example embodiments of the present disclosure. The present disclosure may be practiced in various forms, and should not be construed as being limited to only the embodiments presented.

Hereinafter, the present disclosure will be described in detail based on example embodiments of the present disclosure with reference to the accompanying drawings. Below, embodiments of the present disclosure will be described in detail with reference to the attached drawings.

Various embodiments of the present disclosure are directed to a memory device that reduces the time required for a program (write) operation and/or allows improved threshold voltage distributions of memory cells after the program operation has been completed.

Figure 1:
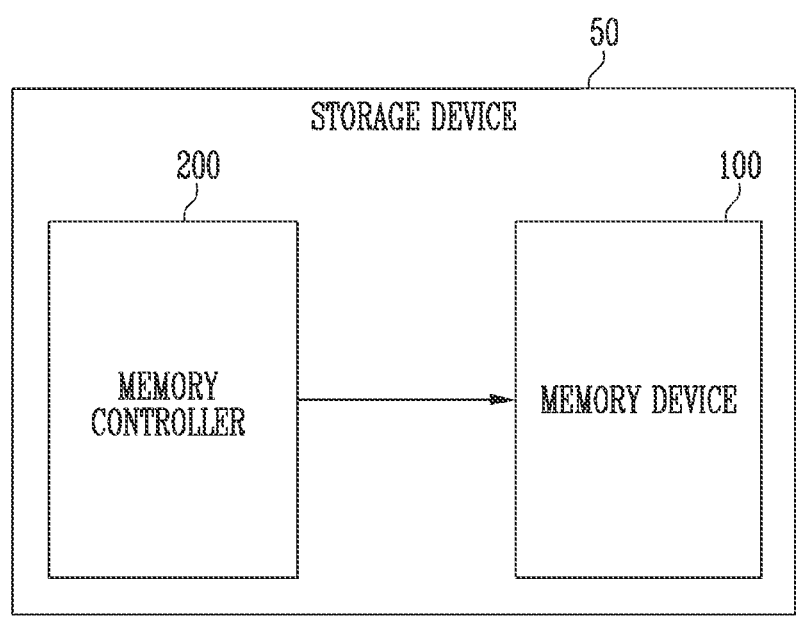
FIG. 1 is a diagram illustrating an example storage device according to an embodiment.

FIG. 1 is a diagram illustrating an example storage device according to an embodiment.

Referring to FIG. 1, a storage device 50 may include a memory device 100 and a memory controller 200 that controls the operation of the memory device. The storage device 50 may be a device that stores data under the control of a host such as, for example, a mobile phone, a smartphone, an MP3 player, a laptop computer, a desktop computer, a game console, a television (TV), a tablet personal computer (PC), an in-vehicle infotainment system, etc.

The storage device 50 may be manufactured as any one of various types of storage devices depending on a communication interface with the host. Accordingly, the storage device 50 may be implemented as, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, a memory stick, etc.

The storage device 50 may be manufactured in any one of various types of package forms such as, for example, package on package (POP), system in package (SIP), system on chip (SOC), multi-chip package (MCP), chip on board (COB), wafer-level fabricated package (WFP), wafer-level stack package (WSP), etc.

The memory device 100 may be configured to store data. The memory device 100 may operate in response to control signals of the memory controller 200. The memory device 100 may include a memory cell array 110 (FIG. 2) that may include a plurality of memory blocks BLK1 . . . BLKz, where each memory block may include a plurality of, for example, memory cells MC1 . . . MCn of FIG. 4.

One memory block may include a plurality of pages. This is explained further with respect to FIG. 2. In an embodiment, a page may be a unit by which data is stored in the memory device 100 or by which data stored in the memory device 100 is read. A memory block may be a unit by which data is erased. In an embodiment, the memory device 100 may take one of many alternative forms, such as, for example, a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change RAM (PRAM), a magnetoresistive RAM (MRAM), a ferroelectric RAM (FRAM), a spin transfer torque RAM (STT-RAM), etc. In the present specification, for convenience of description, the memory device 100 is assumed to be a NAND flash memory.

The memory device 100 may receive a command and an address from the memory controller 200. The memory device 100 may access the area of the memory cell array selected by the address to perform an operation corresponding to the command. For example, the memory device 100 may perform a write operation (i.e., a program operation), a read operation, or an erase operation. During a program operation, the memory device 100 may program data to the area selected by the address. During a read operation, the memory device 100 may read data from the area selected by the address. During an erase operation, the memory device 100 may erase data stored in the area selected by the address.

In an embodiment, the memory device 100 may receive a program command from the memory controller 200 to perform a program operation including two or more program steps. The memory device 100 may then proceed to program data to a selected area in response to the program command from the memory controller 200.

In an embodiment, the memory device 100 may perform a first program step on the selected area, and may thereafter perform a detrap operation of detrapping at least some electrons trapped in a charge trap layer of the memory cells in the selected area. After the detrap operation has been completed, the memory device 100 may perform a second program step on the selected area.

The memory controller 200 may be configured to control the overall operation of the storage device 50.

When power is applied to the storage device 50, the memory controller 200 may run firmware (FW). When the memory device 100 is a flash memory device, the memory controller 200 may run firmware such as a flash translation layer (FTL) for controlling communication between a host and the memory device 100.

In an embodiment, the memory controller 200 may receive data to be stored and a logical block address (LBA) from the host, and may translate the logical block address (LBA) into a physical block address (PBA) indicating the addresses of memory cells in the memory device 100 in which data is to be stored.

The memory controller 200 may control the memory device 100 so that a program operation, a read operation, or an erase operation is performed in response to a request received from the host. During a program operation, the memory controller 200 may provide a program command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may internally generate a program command, an address, and data without receiving a request from the host, and may transmit them to the memory device 100. For example, the memory controller 200 may provide commands, addresses, and data to the memory device 100 to perform background operations, such as a program operation for wear leveling and a program operation for garbage collection.

In an embodiment, the memory controller 200 may control two or more memory devices 100. In this case, the memory controller 200 may, for example, control the memory devices 100 depending on an interleaving scheme to improve operating performance.

The host may communicate with the storage device 50 using at least one of various communication methods such as, for example, Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), Load Reduced DIMM (LRDIMM) communication methods, etc.

In an embodiment, the memory controller 200 may provide a program command that enables a program operation including two or more program steps to be performed to the memory device 100.

Figure 2:
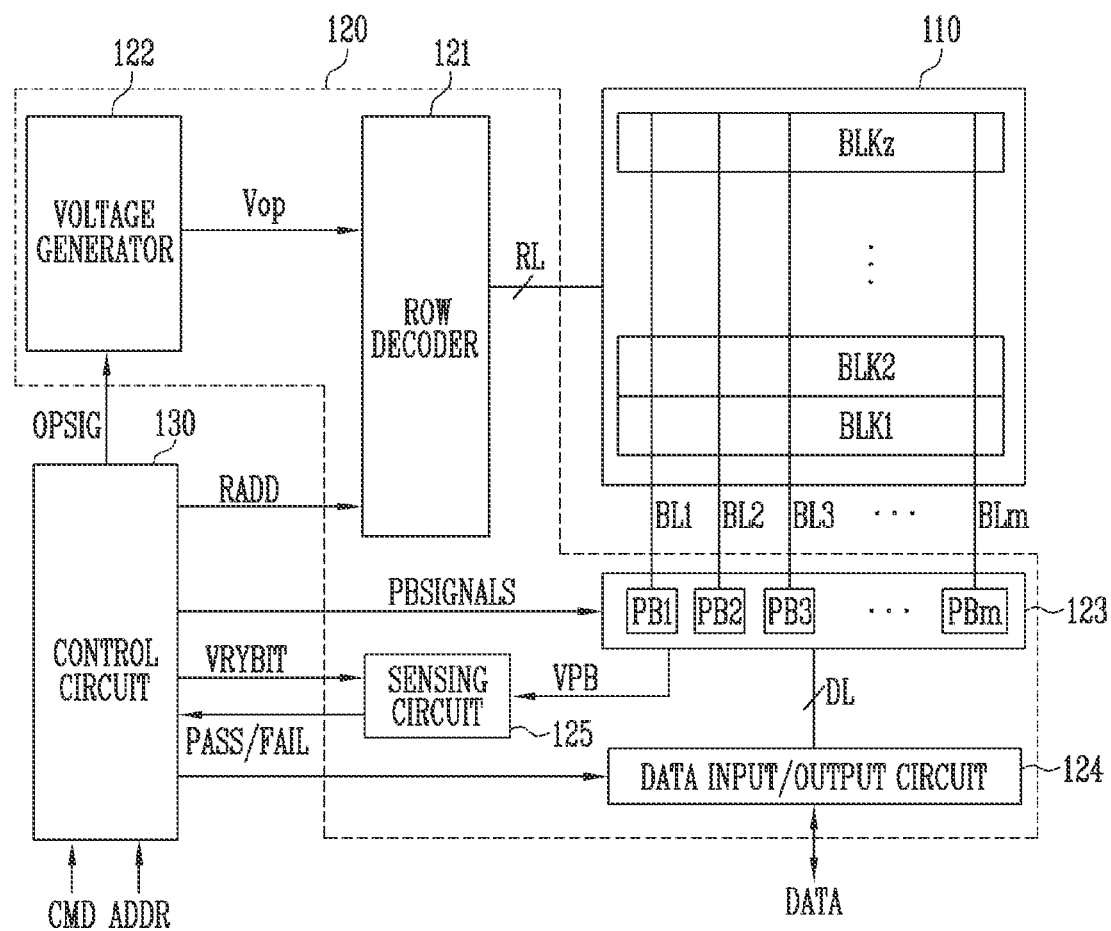
FIG. 2 is a diagram illustrating an example structure of a memory device of FIG. 1.

FIG. 2 is a diagram illustrating an example structure of the memory device of FIG. 1.

Referring to FIG. 2, the memory device 100 may include a memory cell array 110, a peripheral circuit 120, and a control circuit 130.

The memory cell array 110 includes a plurality of memory blocks BLK1 to BLKz. The plurality of memory blocks BLK1 to BLKz are coupled to a row decoder 121 through row lines RL. The memory blocks BLK1 to BLKz may be coupled to a read and write circuit 123 through bit lines BL1 to BLm. Each of the memory blocks BLK1 to BLKz may include a plurality of memory cells such as, for example, MC1 . . . MCn of FIG. 4. In an embodiment, the plurality of memory cells may be nonvolatile memory cells. Memory cells coupled to the same word line, among the plurality of memory cells, are defined as one physical page. Therefore, the memory cell array 110 may include a plurality of pages.

Each of the memory cells of the memory device 100 may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits. However, the number of data bits per memory cell need not limit an embodiment of the disclosure.

The peripheral circuit 120 may include the row decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 to perform a program operation, a read operation, and an erase operation.

The row decoder 121 is coupled to the memory cell array 110 through the row lines RL. The row lines RL may include at least one source select line, a plurality of word lines, and at least one drain select line.

The row decoder 121 may decode a row address RADD received from the control circuit 130. In an embodiment, the control circuit 130 may be implemented as hardware, firmware/software, or a combination of hardware and firmware/software. The term "firmware/software" is interpreted as firmware and/or software. For example, the control circuit 130 may operate in accordance with an algorithm and/or a processor processing executable code. The row decoder 121 may select at least one of the memory blocks BLK1 to BLKz according to the decoded address. Further, the row decoder 121 may select at least one word line of the selected memory block so that voltages generated by the voltage generator 122 are applied to the at least one word line according to the decoded address.

For example, during a program operation, the row decoder 121 may apply a program voltage to a selected word line and apply a program pass voltage having a level lower than that of the program voltage to unselected word lines. During a verify step of the program operation, the row decoder 121 may apply a verify voltage to a selected word line and apply a verify pass voltage having a level higher than that of the verify voltage to unselected word lines. During a read operation, the row decoder 121 may apply a read voltage to a selected word line and apply a read pass voltage higher than the read voltage to unselected word lines.

In accordance with an embodiment, the erase operation of the memory device 100 is performed on a memory block basis. During the erase operation, addresses ADDR input to the memory device 100 include a block address. The row decoder 121 may decode the block address and select one memory block according to the decoded block address. During an erase operation, the row decoder 121 may apply a ground voltage to word lines coupled to the selected memory block.

The voltage generator 122 may generate a plurality of voltages using an external supply voltage provided to the memory device 100. The voltage generator 122 may operate under the control of the control circuit 130.

In an embodiment, the voltage generator 122 may generate an internal supply voltage Vop by regulating external supply voltage (not illustrated). The internal supply voltage Vop generated by the voltage generator 122 may be used as an operating voltage for the memory device 100.

In an embodiment, the voltage generator 122 may generate a plurality of voltages using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages. For ease of description, the various voltages generated by the voltage generator 122 may also be referred to as Vop.

The voltage generator 122 may include a plurality of pumping capacitors for receiving the internal supply voltage to generate a plurality of voltages having various voltage levels, and may generate a plurality of voltages by selectively enabling the plurality of pumping capacitors under the control of the control circuit 130.

The generated voltages may be used by the row decoder 121 to provide the row lines RL to the memory cell array 110.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm may operate under the control of the control circuit 130.

The first to m-th page buffers PB1 to PBm may transmit/receive data DATA to/from the data input/output circuit 124. During a program operation, the first to m-th page buffers PB1 to PBm may receive data to be stored from the data input/output circuit 124 via data lines DL. The data input/output circuit 124 may receive the data to be stored as data DATA from an external device (not illustrated).

In an embodiment, during a program operation, the first to m-th page buffers PB1 to PBm may transfer the data DATA to be stored, received through the data input/output circuit 124, to selected memory cells through the bit lines BL1 to BLm when a program pulse is applied to a selected word line. The memory cells in a selected page are programmed based on the received data DATA. Memory cells coupled to respective bit lines to which a program enable voltage (e.g., a ground voltage) is applied may have increased threshold voltages. The threshold voltages of memory cells coupled to respective bit lines to which a program inhibit voltage (e.g., a supply voltage) is applied may maintain as is. During a program verify operation, the first to m-th page buffers PB1 to PBm may read the data DATA stored in the selected memory cells from the selected memory cells through the bit lines BL1 to BLm. The threshold voltages may be used to verify that the memory cells are programmed correctly with regard to the received data DATA.

During a read operation, the read and write circuit 123 may read data from the memory cells in the selected page through the bit lines BL, and may store the read data in the first to m-th page buffers PB1 to PBm. The data in the page buffers PB1 to PBm may then be transmitted to the data input/output circuit 124, which then outputs the received data from the page buffers PB1 to PBm as data DATA.

During an erase operation, the read and write circuit 123 may allow the bit lines BL1 to BLm to float. In an embodiment, the read and write circuit 123 may include a column select circuit.

The data input/output circuit 124 is coupled to the first to m-th page buffers PB1 to PBm through the data lines DL. The data input/output circuit 124 may operate in response to the control of the control circuit 130.

The data input/output circuit 124 may include a plurality of input/output buffers (not illustrated) that receive the input data DATA. During a program operation, the data input/output circuit 124 receives the data DATA to be stored from an external device, which may be an external memory controller (not illustrated). During a read operation, the data input/output circuit 124 outputs the data DATA, received from the first to m-th page buffers PB1 to PBm included in the read and write circuit 123, to the external memory controller.

During a read operation or a verify operation, the sensing circuit 125 may generate a reference current in response to an enable bit signal VRYBIT generated by the control circuit 130, and may output a pass signal PASS or a fail signal FAIL to the control circuit 130 by comparing a sensing voltage VPB received from the read and write circuit 123 with a reference voltage generated by the reference current.

In an embodiment, the sensing circuit 125 may include a current sensing circuit that counts the number of fail bits indicating the number of cells among target cells that failed to program correctly.

The control circuit 130 may be coupled to the row decoder 121, the voltage generator 122, the read and write circuit 123, the data input/output circuit 124, and the sensing circuit 125. The control circuit 130 may control the overall operation of the memory device 100. The control circuit 130 may operate in response to a command CMD and the addresses ADDR transferred from an external device.

The control circuit 130 may control the peripheral circuit 120 by generating various types of signals in response to the command CMD and the addresses ADDR. For example, the control circuit 130 may generate an operation signal OPSIG, the row address RADD, read and write circuit control signals PBSIGNALS, and the enable bit VRYBIT in response to the command CMD and the addresses ADDR. The control circuit 130 may output the operation signal OPSIG to the voltage generator 122, output the row address RADD to the row decoder 121, output the read and write circuit control signals PBSIGNALS to the read and write circuit 123, and output the enable bit VRYBIT to the sensing circuit 125. In addition, the control circuit 130 may determine whether a verify operation has passed or failed in response to the pass or fail signal PASS or FAIL output from the sensing circuit 125.

In an embodiment, the control circuit 130 may receive a program command from the memory controller 200. The control circuit 130 may control the peripheral circuit 120 so that the memory device 100 performs a program operation on memory cells coupled to a selected word line in response to a program command received from the memory controller. In detail, the control circuit 130 may control the peripheral circuit 120 so that a program operation including two or more program steps is performed on selected memory cells coupled to the selected word line. The peripheral circuit 120 may perform a first program step on at least the selected memory cells under the control of the control circuit 130. When the first program step is completed, the peripheral circuit 120 may perform a detrap operation of detrapping at least some electrons trapped in the selected memory cells. When the detrap operation is completed, the peripheral circuit 120 may perform a second program step.

Figure 3:
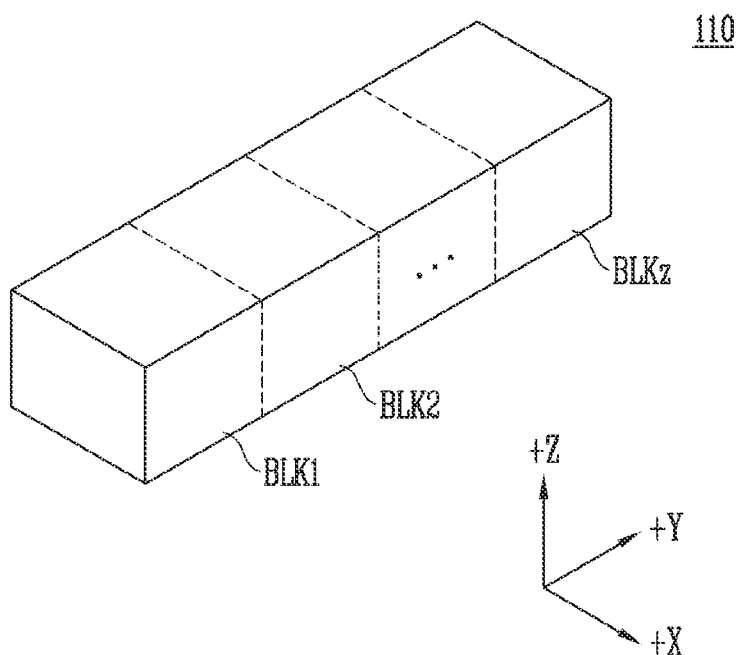
FIG. 3 is a diagram illustrating an example embodiment of a memory cell array of FIG. 2.

FIG. 3 is a diagram illustrating an example embodiment of the memory cell array of FIG. 2.

Referring to FIG. 3, the memory cell array 110 includes a plurality of memory blocks BLK1 to BLKz. Each of the memory blocks may have a three-dimensional (3D) structure. Each of the memory blocks may include a plurality of memory cells stacked on a substrate. The plurality of memory cells are arranged in +X, +Y, and +Z directions. The structure of each memory block will be described in greater detail below with reference to FIG. 4.

Figure 4:
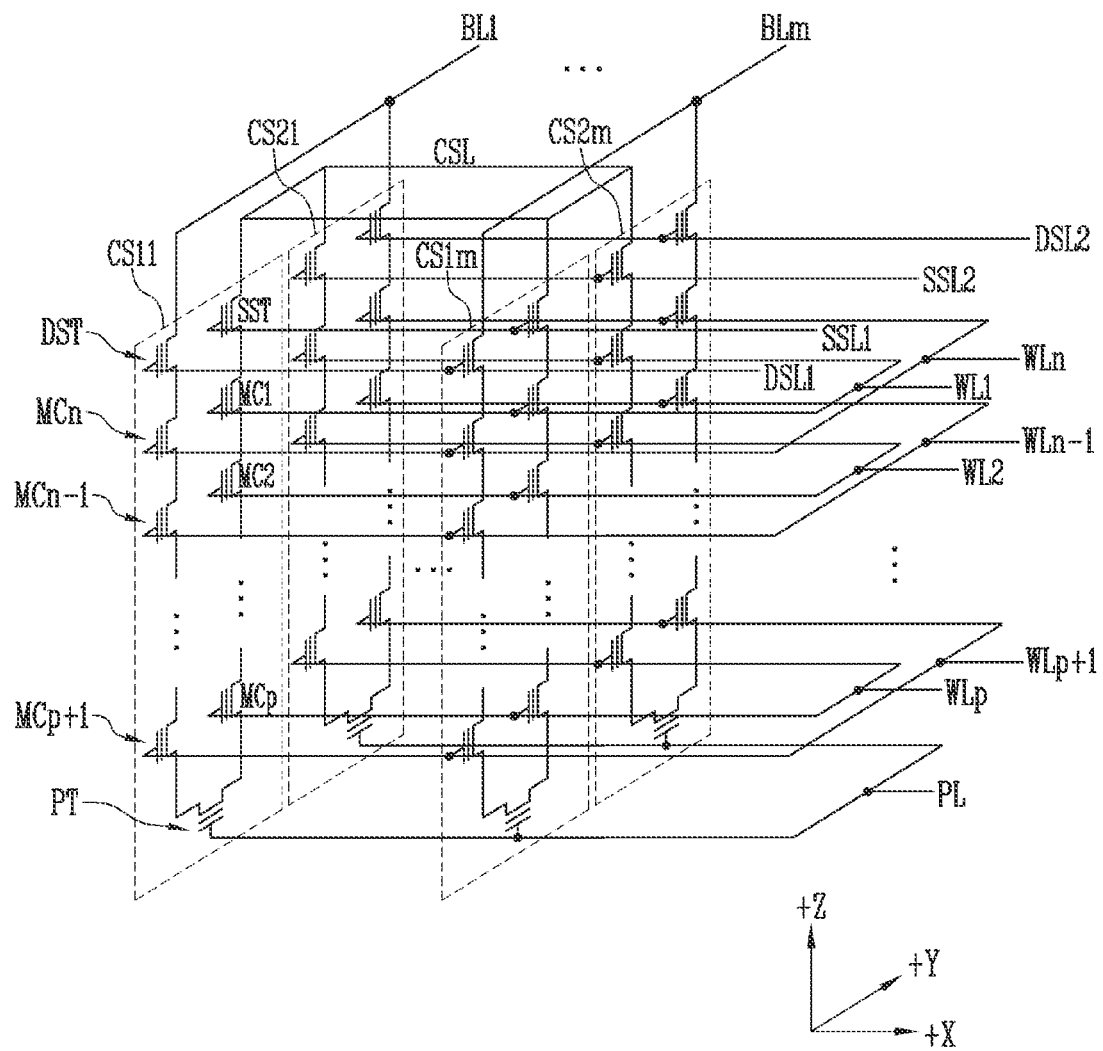
FIG. 4 is a circuit diagram illustrating an example memory block BLKa of memory blocks BLK1 to BLKz of FIG. 2.

FIG. 4 is a circuit diagram illustrating an example memory block BLKa of memory blocks BLK1 to BLKz of FIG. 2.

Referring to FIG. 4, the memory block BLKa includes a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings are arranged in a row direction (i.e. a positive (+) X direction). In FIG. 4, two cell strings are illustrated as being arranged in a column direction (i.e. a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be in each cell string. In an embodiment, a pillar for providing at least one channel layer, the tunneling insulating layer, the charge storage layer, and the blocking insulating layer may be in each cell string.

The source select transistor SST of each cell string is coupled between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 4, source select transistors of cell strings CS11 to CS1m in a first row are coupled in common to a first source select line SSL1. The source select transistors of cell strings CS21 to CS2m in a second row are coupled in common to a second source select line SSL2.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are coupled in series between the source select transistor SST and the pipe transistor PT. The p+1-th to n-th memory cells MCp+1 to MCn are sequentially arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is coupled between the corresponding bit line and the memory cell MCn. The cell strings in a row direction are coupled to drain select lines extending in a row direction. Gates of drain select transistors of cell strings CS11 to CS1m in the first row are coupled to a first drain select line DSL1. Gates of drain select transistors of cell strings CS21 to CS2m in a second row are coupled to a second drain select line DSL2.

Cell strings arranged in a column direction are coupled to bit lines extending in a column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form one page. For example, memory cells coupled to the first word line WL1, among the cell strings CS11 to CS1m in the first row, form one page. Memory cells coupled to the first word line WL1, among the cell strings CS21 to CS2m in the second row, form an additional page. Cell strings arranged in the direction of a single row may be selected by selecting any one of the drain select lines DSL1 and DSL2. One page may be selected from the selected cell strings by selecting any one of the word lines WL1 to WLn.

Figure 5:
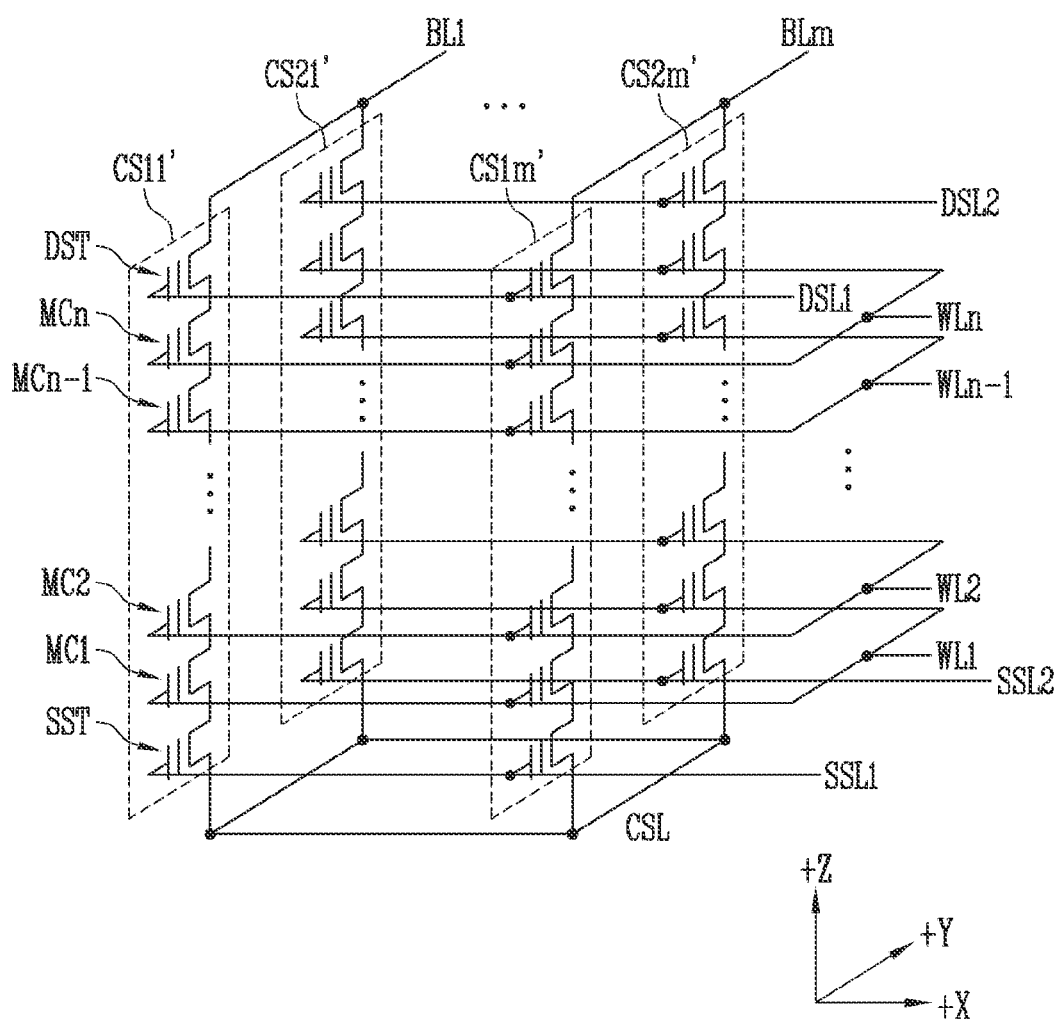
FIG. 5 is a circuit diagram illustrating an example memory block BLKb of the memory blocks BLK1 to BLKz of FIG. 2.

FIG. 5 is a circuit diagram illustrating an example memory block BLKb of the memory blocks BLK1 to BLKz of FIG. 2.

In an embodiment, instead of the first to m-th bit lines BL1 to BLm, even bit lines and odd bit lines may be provided. Further, even-numbered cell strings, among cell strings CS11 to CS1m or CS21 to CS2m arranged in a row direction, may be coupled to respective even bit lines, and odd-numbered cell strings, among the cell strings CS11 to CS1m or CS21 to CS2m arranged in the row direction, may be coupled to respective odd bit lines.

In an embodiment, one or more of first to n-th memory cells MC1 to MCn may be used as dummy memory cells. For example, the one or more dummy memory cells may be provided to reduce an electric field between a source select transistor SST and memory cells MC1 to MCp. Alternatively, the one or more dummy memory cells may be provided to reduce an electric field between a drain select transistor DST and memory cells MCp+1 to MCn. As the number of dummy memory cells provided increases, the reliability of operation of the memory block BLKb may be improved, whereas the size of the memory block BLKb may increase. As the number of dummy memory cells that are provided decreases, the size of the memory block BLKb may decrease, whereas the reliability of operation of the memory block BLKb may deteriorate.

In order to efficiently control the one or more dummy memory cells, respective dummy memory cells may have required threshold voltages. Before or after an erase operation on the memory block BLKb is performed, program operations may be performed on all or some of the dummy memory cells. When the erase operation is performed after the program operations have performed, the respective dummy memory cells may have the required threshold voltages by controlling voltages to be applied to dummy word lines coupled to respective dummy memory cells.

Figure 6:
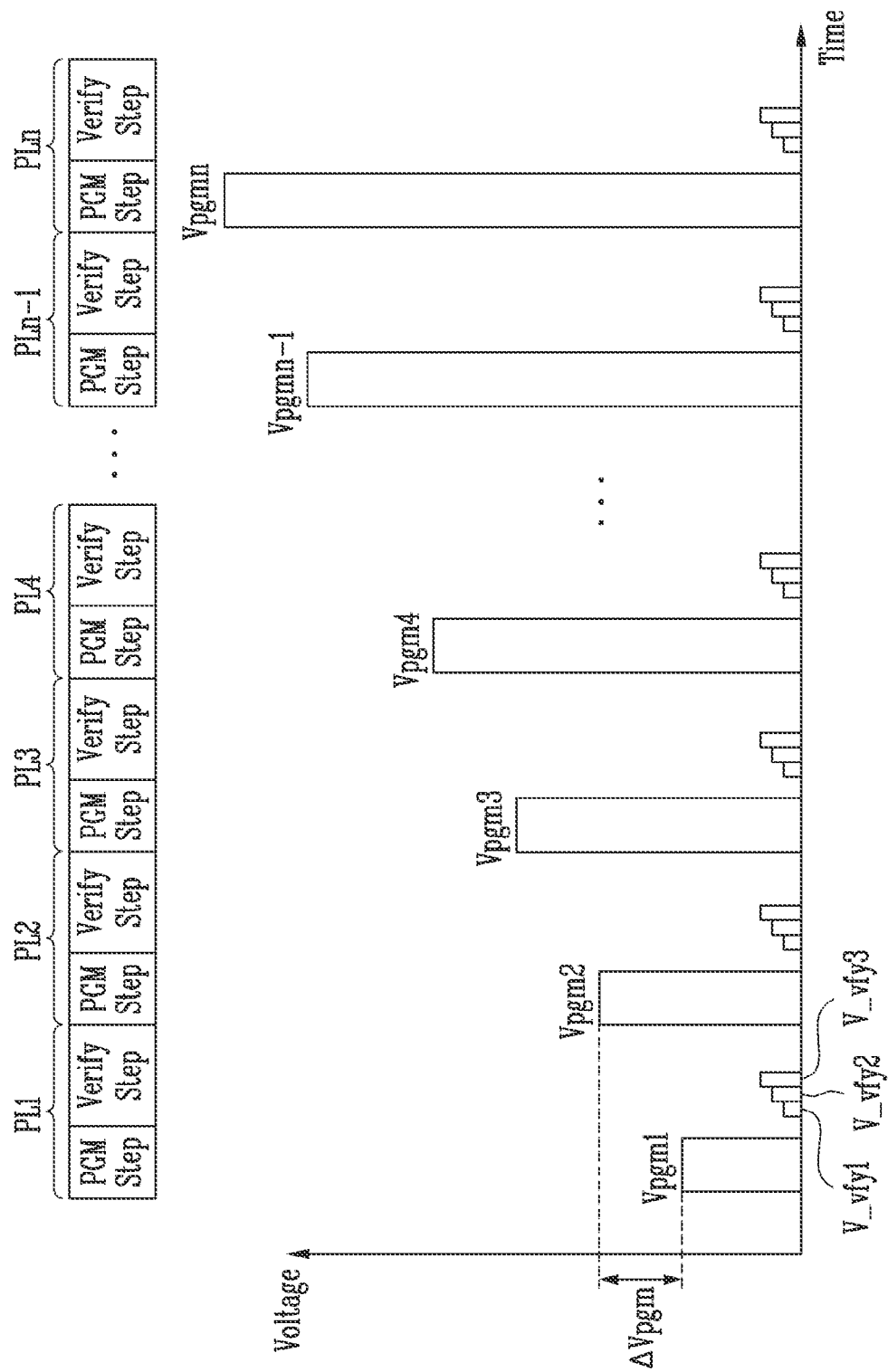
FIG. 6 is a diagram illustrating an example program operation according to an embodiment.

FIG. 6 is a diagram for illustrating an example program operation according to an embodiment.

Referring to FIG. 6, the program operation may include a plurality of program loops PL1 to PLn. The memory device may perform a program operation so that each of selected memory cells can be in a desired one of the plurality of program states by performing the plurality of program loops PL1 to PLn. For example, a multi-level cell (MLC) may be a memory cell that can store two data bits that indicate four states—an erased state and first to third program states. Different memory cells may take different number of program loops before a valid state is programmed in the memory cells. Accordingly, some memory cells may be programmed with valid data in fewer program loops than others.

Each of the plurality of program loops PL1 to PLn may include a program voltage apply step (PGM step) of applying a program voltage and a verify step of verifying whether the memory cells have been programmed by applying verify voltages.

At the program voltage apply step, a program voltage apply operation of applying the program voltage to a selected word line coupled to selected memory cells may be performed. Each of the selected memory cells may be programmed to a program state corresponding to any one of first to n-th states (where n is a natural number) through the program voltage apply operation.

In an embodiment, the program voltage may be determined based on an incremental step pulse programming (ISPP) method. That is, the level of the program voltage may be increased or decreased by a step voltage in stages as the program loops are repeated. The number of applications of program voltages used in respective program loops, the voltage levels of the program voltages, voltage application times, etc., may be determined in various forms under the control of the memory controller 200.

A pass voltage may be applied to the unselected word lines. In an embodiment, pass voltages having the same voltage level may be applied to the unselected word lines. In another embodiment, the pass voltages may have different voltage levels depending on the locations of word lines.

A ground voltage may be applied as a program enable voltage to selected bit lines coupled to the memory cells to be programmed. A program inhibit voltage may be applied to unselected bit lines, which are bit lines coupled to memory cells that are not to be programmed.

At the program verify step, the memory device may apply the verify voltages to the selected word line and apply a verify pass voltage to the unselected word lines. The memory device may sense voltages or currents output through the bit lines to which the memory cells coupled to the selected word line are respectively coupled, and may determine whether the verify step has passed or failed based on the results of sensing.

At the verify step, a program verify operation may be performed for at least one of the first to n-th program states. For example, when memory cells to be programmed to a k-th state (where k is a natural number that is equal to or greater than 1 and is less than or equal to n) are verified in the program verify step as being in the k-th state through the verify voltage corresponding to the k-th state, those memory cells may be referred to as off-cells, and the program verify operation for the k-th state may pass.

In FIG. 6, when the selected memory cells are multi-level cells (MLC), each storing two data bits, the selected memory cells may be programmed to any one of an erased state and first to third program states. The number of data bits stored in the memory cell is not limited to the present embodiment.

When the first program loop PL1 is performed, a first program voltage Vpgm1 is applied, and thereafter first to third verify voltages V_vfy1 to V_vfy3 are sequentially applied to verify the program states of the plurality of memory cells. Memory cells with the target states of the first program state may be verified using the first verify voltage V_vfy1. Memory cells with the target states of the second program state may be verified using the second verify voltage V_vfy2. Memory cells with the target states of the third program state may be verified using the third verify voltage V_vfy3. The number of verify voltages is not limited to the present embodiment.

The memory cells that have passed verification through respective one of the verify voltages V_vfy1 to V_vfy3 may be determined to have the correct target states, and may then be program inhibited in subsequent program loops for the present program operation. A program inhibit voltage may be applied to the bit lines coupled to the program-inhibited memory cells. In the second program loop PL2, a second program voltage Vpgm2 higher than the first program voltage Vpgm1 by a unit voltage ΔVpgm may be applied to one or more selected word lines.

Thereafter, a verify operation may be performed in the same way as the verify operation in the first program loop PL1. In an example, the term "verification pass" indicates that each memory cell is read as an off-cell using the corresponding verify voltage. The programming loops may continue until all selected memory cells are programmed correctly or the final program loop is finished. If there are memory cells that still did not program correctly after the final program loop, the page that contains those memory cells may be marked as invalid.

As described above, when the memory device programs multi-level cells (MLC), the memory device verifies the memory cells having respective program states as target states using the first to third verify voltages V_vfy1 to V_vfy3.

Figure 7:
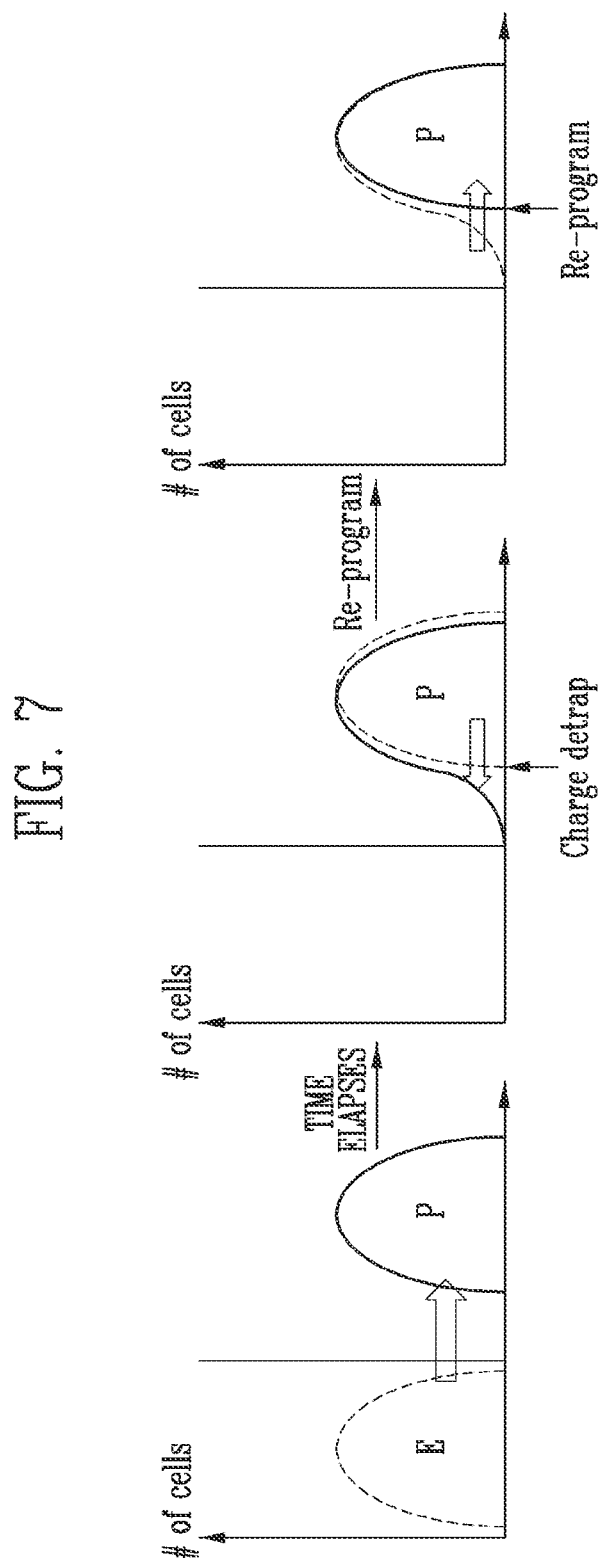
FIG. 7 is a diagram illustrating an example of detrapping electrons from a charge trap layer for programmed memory cells and a second program step on the memory cells.

FIG. 7 is a diagram illustrating an example of detrapping electrons from a charge trap layer for programmed memory cells and a second program step on the memory cells.

During a program operation, when a program voltage is applied to selected memory cells, electrons may be trapped in a charge trap layer for the selected memory cells. When electrons are trapped in the charge trap layer, the threshold voltages of the selected memory cells may increase. When the electrons trapped in the charge trap layer are detrapped, the threshold voltages of the selected memory cells may decrease.

Referring to FIG. 7, the graph in the left portion of the drawing indicates the threshold voltage distribution of selected memory cells after a first program step has been completed on the selected memory cells. The graph in the middle portion of the drawing indicates the threshold voltage distribution of the selected memory cells after a certain time has elapsed since the completion of the first program step performed on the selected memory cells. The graph in the right portion of the drawing indicates the threshold voltage distribution of selected memory cells after a second program step (re-program step) performed on the selected memory cells has been completed. A program step after a first program step may be referred to as, for example, a re-program step.

Referring to the left graph in FIG. 7, when the first program step on the selected memory cells in an erased state E has been completed, the threshold voltages of the selected memory cells may be shifted to a program state P.

Referring to the middle graph of FIG. 7, as time elapses after the completion of the first program step, electrons trapped in the charge trap layer for the selected memory cells may be detrapped. This may be referred to as natural detrapping. When electrons are detrapped from the charge trap layer, the threshold voltages of the selected memory cells may decrease.

Referring to the right graph of FIG. 7, after a certain time elapsed since the completion of the first program step, a second program step (re-program step) may be performed on the selected memory cells. The threshold voltage distribution of the selected memory cells occurring after the second program step has been performed may be narrower than that of the selected memory cells occurring after the first program step has been completed.

Figure 8:
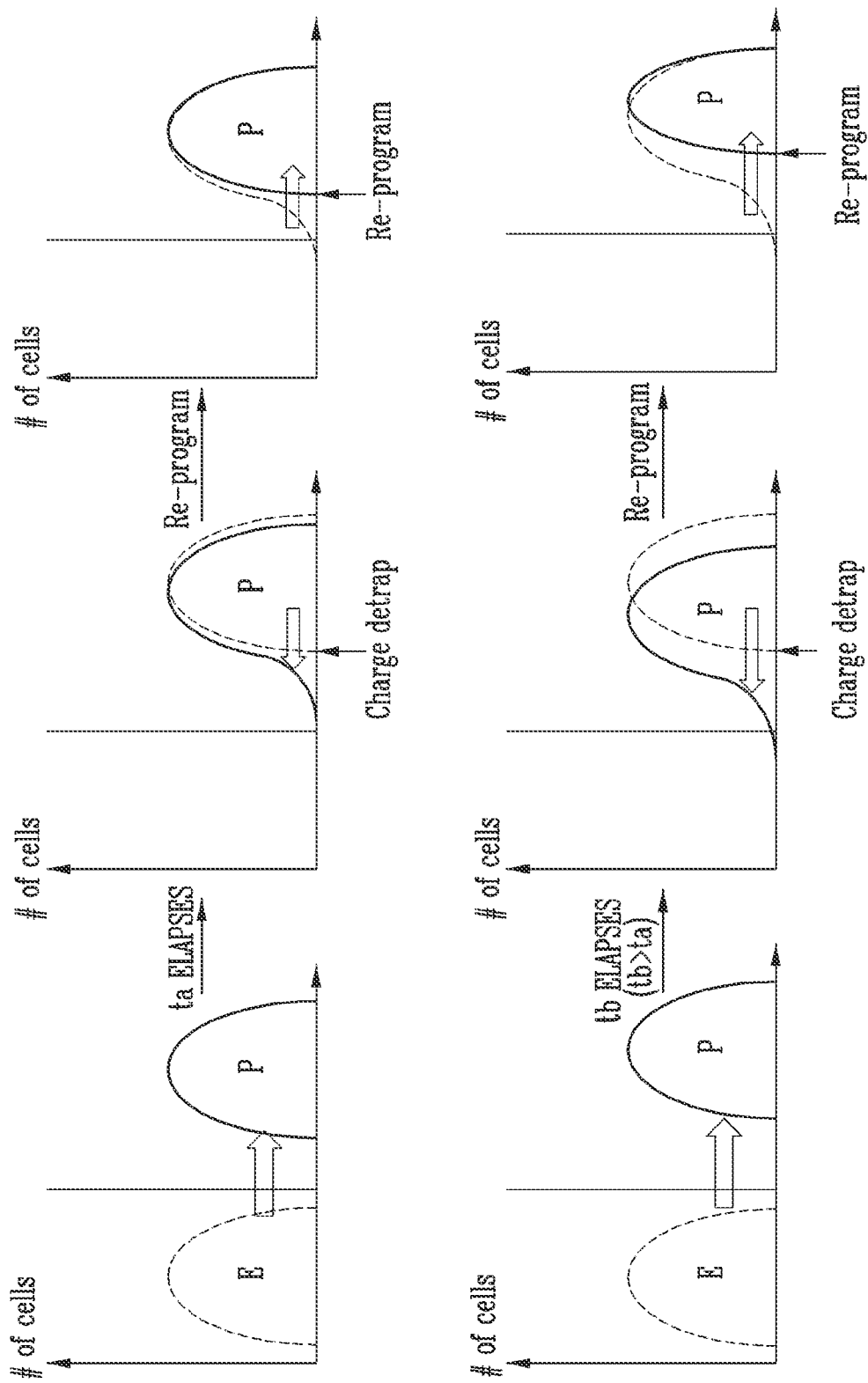
FIG. 8 is a diagram illustrating a difference between the threshold voltage distributions of memory cells depending on the time elapsed from the completion of a first program step to a time point before a second program step starts.

FIG. 8 is a diagram illustrating a difference between threshold voltage distributions of memory cells depending on the time elapsed from the completion of a first program step to a time point before a second program step starts.

Graphs in the upper portion of FIG. 8 show threshold voltage distributions of selected memory cells in the case where, after time ta has elapsed since performance of a first program step on the selected memory cells, a second program step (re-program step) is performed on the selected memory cells.

Graphs in the lower portion of FIG. 8 show threshold voltage distributions of selected memory cells in the case where, after time tb longer than time ta has elapsed since performance of a first program step on the selected memory cells, a second program step (re-program step) is performed on the selected memory cells.

Referring to FIG. 8, where the threshold voltage distributions of the selected memory cells have shifted, the extent of the shift when time tb has elapsed since the completion of the first program step performed on the selected memory cells may be greater than that when time ta has elapsed. Time tb is longer than time ta. That is, the number of electrons detrapped in the charge trap layer for the selected memory cells may increase over time. Therefore, the extent to which the threshold voltage distribution of the selected memory cells is shifted to the left may increase as time progressed since the completion of the first program step.

Referring to the two right graphs in FIG. 8, the threshold voltage distribution of selected memory cells in the lower graph may be narrower than that of the selected memory cells in the upper graph. That is, as the time increases from a time point at which the first program step performed on the selected memory cells has been completed to a time point at which the second program step starts, the threshold voltage distribution of the selected memory cells after the completion of the second program operation may narrow.

However, when the time from the time point at which the first program step performed on the selected memory cells has been completed to the time point at which the second program step starts is increased in order to improve threshold voltage distributions, the total time required for the entire program operation on the selected memory cells is increased.

Figure 9:
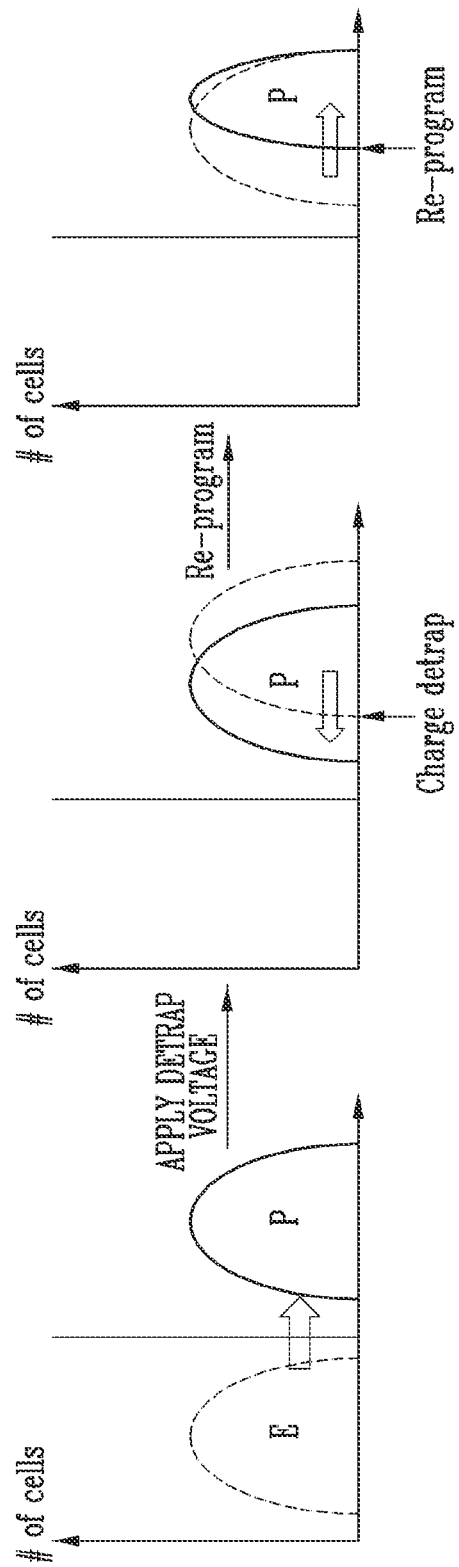
FIG. 9 is a diagram illustrating an example detrap operation according to an embodiment.

FIG. 9 is a diagram illustrating an example detrap operation according to an embodiment.

Referring to FIG. 9, after a first program step has been performed on selected memory cells, a detrap operation may be performed on the selected memory cells. The detrap operation may be an operation of detrapping electrons trapped in a charge trap layer for the selected memory cells after the first program step has been completed.

Referring to a graph in the middle portion of FIG. 9, when the detrap operation is performed on the selected memory cells, some electrons trapped in the charge trap layer for the selected memory cells may be detrapped. When the electrons trapped in the charge trap layer are detrapped, the threshold voltage distribution of the selected memory cells may be shifted to the left. The detrap operation may be an operation of applying a detrap voltage to the selected memory cells. In an embodiment, the magnitude of the detrap voltage may be, for example, identical to or substantially similar to the magnitude of an erase voltage for erasing data stored in programmed memory cells. That is, the memory device may, for example, apply a ground voltage to a word line coupled to the selected memory cells and form a potential having the same magnitude as the erase voltage in a channel area of the selected memory cells, thus detrapping some of electrons trapped in the charge trap layer.

When the detrap operation performed on the selected memory cells is completed, a second program step may be performed on the selected memory cells. The number of electrons detrapped by the detrap operation may be greater than the number of electrons that are naturally detrapped (i.e., electrons that are detrapped without applying a detrap voltage to the selected memory cells) for the same period of time. Therefore, in an embodiment, the threshold voltage distribution of the selected memory cells after the completion of the second program step (re-program step) may be improved while a delay in the total time required for the entire program operation on the selected memory cells is minimized.

Figure 10:
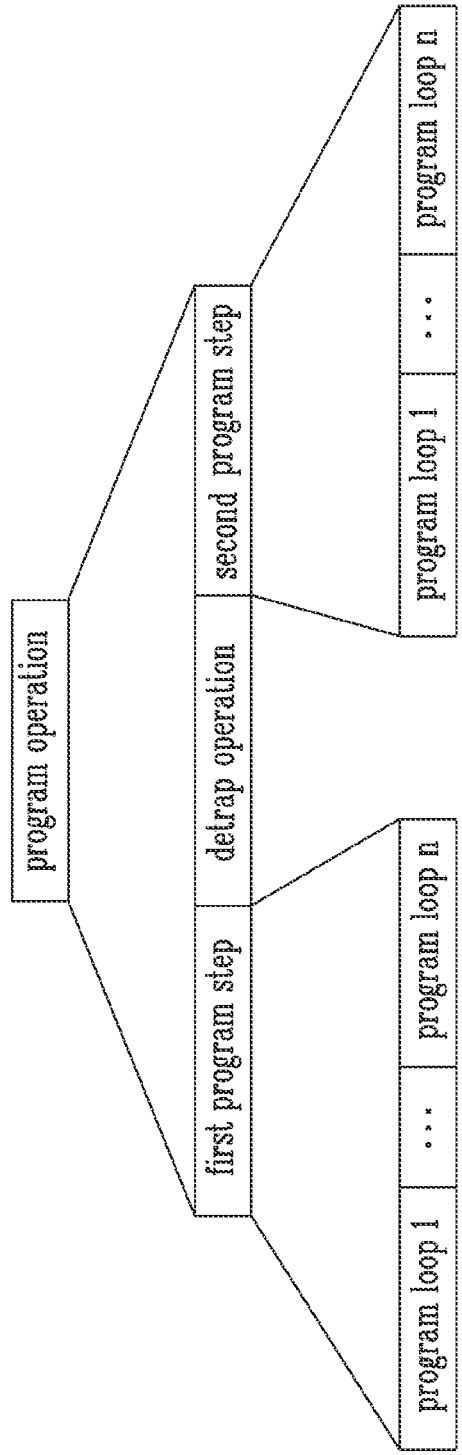
FIG. 10 is a diagram illustrating an example program operation according to an embodiment.

FIG. 10 is a diagram illustrating an example program operation according to an embodiment.

Referring to FIG. 10, the program operation according to an embodiment may include a first program step, a detrap operation, and a second program step. The first program step, the detrap operation, and the second program step may be, for example, sequentially performed.

In an example, each of the first program step and the second program step may include a plurality of program loops. Each program loop may include a program voltage apply step and a verify step. The program voltage apply step may be the step of applying a program voltage to a word line coupled to selected memory cells. The program voltage may be increased by a step voltage whenever the number of program loops increases. The verify step may be the step of verifying whether each selected memory cell has been programmed to a target program state.

In an embodiment, the memory controller 200 may provide the memory device 100 with a program command that enables the memory device 100 to perform a program operation to be performed on the selected memory cells. The program operation may include a first program step, a detrap operation, and a second program step.

Figure 11:
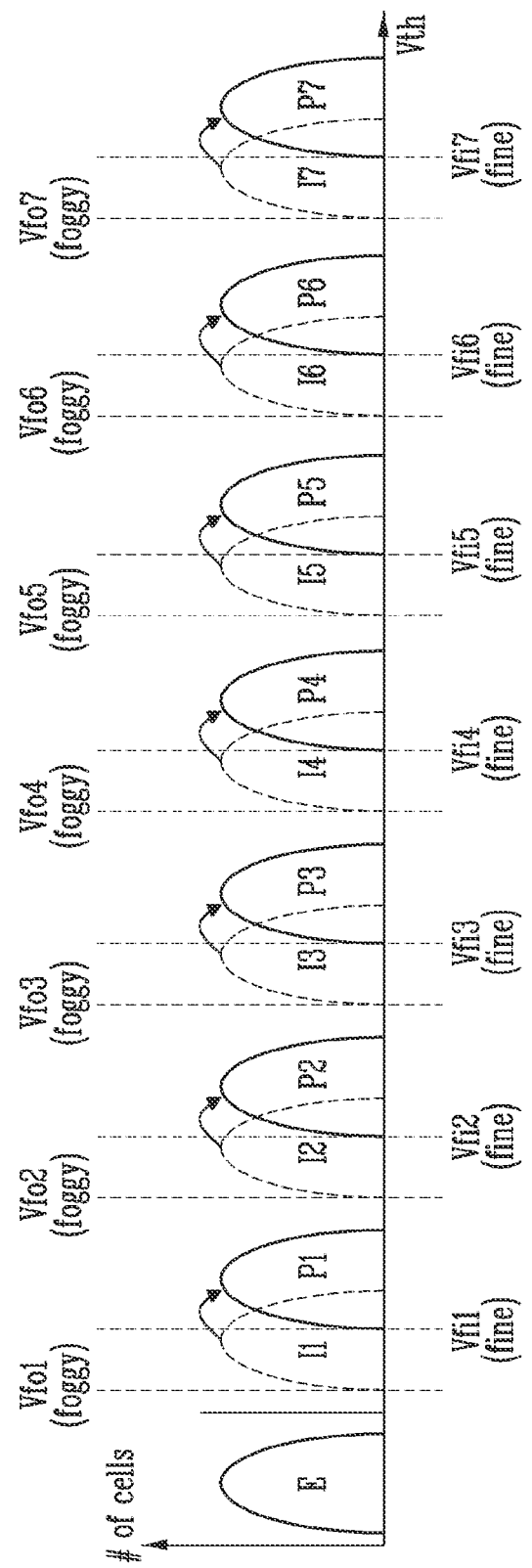
FIG. 11 is a diagram illustrating an example program operation including two or more program steps.

FIG. 11 is a diagram for illustrating an example program operation including two or more program steps.

Referring to FIG. 11, a horizontal axis denotes the threshold voltages of memory cells and a vertical axis denotes the number of memory cells. In FIG. 11, one memory cell may be implemented as a triple-level cell (TLC) that stores 3 bits of data. That is, the memory device may store 3 bits of data in each memory cell by performing a program operation in a TLC scheme.

Referring to FIG. 11, each memory cell may store data by performing a foggy program operation and a fine program operation. FIG. 11 is a diagram illustrating threshold voltage distributions when a foggy program operation and a fine program operation are performed on memory cells. In detail, dotted lines indicate the threshold voltage distributions of memory cells after the foggy program operation has been performed, and solid lines indicate the threshold voltage distributions of memory cells after the fine program operation has been performed.

The program operation may be divided into a foggy program operation and a fine program operation, with each operation separately performed. That is, the program operation may be completed when both the foggy program operation and the fine program operation are completed on the memory cells. When the program operation is completed, each memory cell may have a threshold voltage corresponding to one of a plurality of program states for the memory cell depending on the data stored in the corresponding memory cell.

For example, each memory cell may be programmed to one of an erased state E and first to seventh program states P1 to P7. Successfully programming the memory cell to a state may mean that the memory cell has a threshold voltage belonging to a threshold voltage distribution for the corresponding state.

For example, the memory cells to be programmed to the first program state P1 may have threshold voltages corresponding to the first intermediate state I1. The memory cells to be programmed to the second program state P2 to the seventh program state P7 may similarly have respective threshold voltages corresponding to the second intermediate state I2 to the seventh intermediate state I7.

During the foggy program operation, a verify operation using foggy verify voltages Vfo1 to Vfo7 may be performed. During the fine program operation, a verify operation using fine verify voltages Vfi1 to Vfi7 may be performed.

After the foggy program operation has been performed, the fine program operation may be performed. The fine program operation may be an operation of programming memory cells so that the memory cells have threshold voltages that correspond to states corresponding to the data to be stored in the memory cells. When the fine program operation is performed, each of the memory cells may have a threshold voltage corresponding to one of eight program states that includes the erased state E and the first to seventh program states P1 to P7.

In an embodiment, the foggy program operation may correspond to the first program step, and the fine program operation may correspond to the second program step. That is, the memory device may perform the foggy program operation as the first program step on selected memory cells. When the foggy program operation performed on the selected memory cells is completed, a detrap operation may be performed on the selected memory cells. The detrap operation may be an operation of detrapping at least some electrons trapped in a charge trap layer for the memory cells for which the foggy program operation has been completed. When the detrap operation on the selected memory cells is completed, the memory device may perform the fine program operation as the second program step on the selected memory cells.

The first program step and the second program step may be performed in various forms without being limited to the above-described foggy program operation and fine program operation.

In another example embodiment, the first program step may be intended to program the selected memory cells to an intermediate program state, and the second program step may be intended to program the memory cells to a target program state. In still another example embodiment, the first program step may be intended to program the selected memory cells to a target program state, and the second program step may be intended to re-program the selected memory cells so that threshold voltage distributions corresponding to respective program states are narrower. A detrap operation may be performed on the selected memory cells after the first program step has been completed but before the second program step is performed.

However, the program operation including two or more program steps is not limited to the presently described embodiments. In another embodiment, detrap operation may be performed, for example, in parallel with at least a portion of the first program step. Accordingly, the detrap operation may be started before the first program step is finished. In another embodiment, the program operation may include the first program step and the second program step, where the first program step includes the detrap operation. In another embodiment, the second program step may start before the detrap operation is finished. In another embodiment, the second program step may include the detrap operation.

Figure 12:
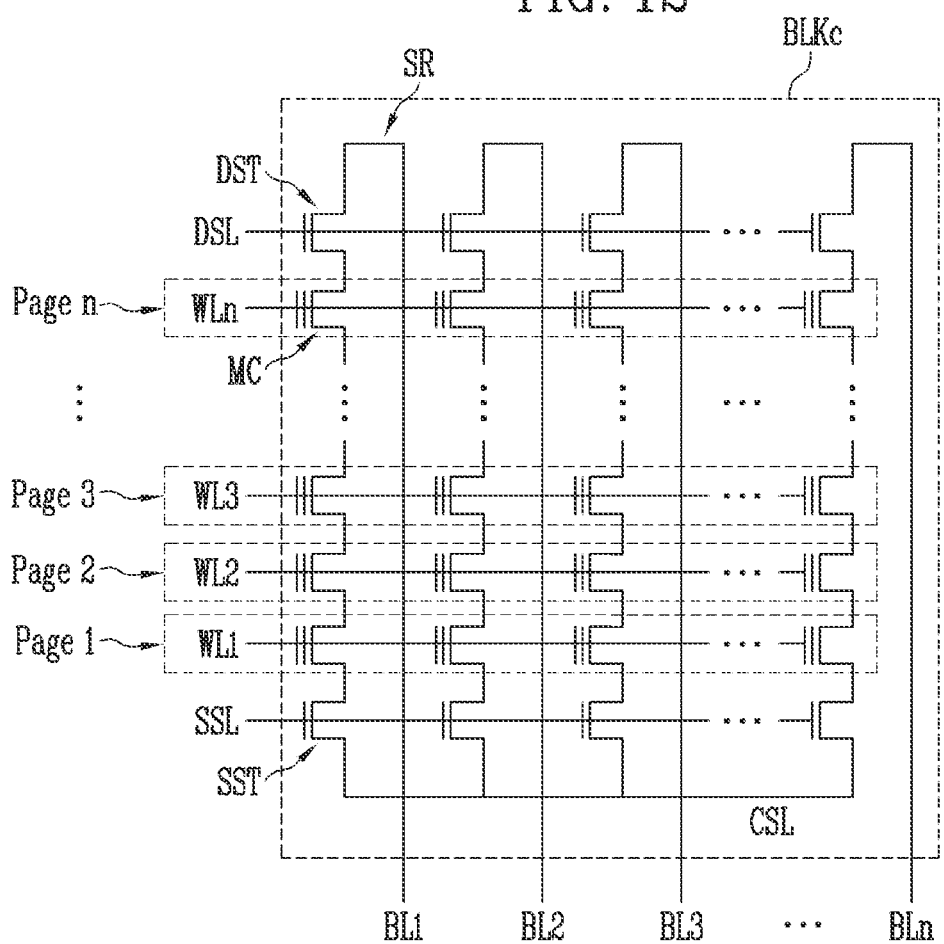
FIG. 12 is a circuit diagram illustrating an example memory block BLKc of the memory blocks BLK1 to BLKz of FIG. 2.

FIG. 12 is a circuit diagram illustrating an example memory block BLKc of the memory blocks BLK1 to BLKz of FIG. 2.

Referring to FIG. 12, the memory block BLKc may include a plurality of strings SR. The plurality of strings SR may be respectively coupled to a plurality of bit lines BL1 to BLn. Each string SR may include a source select transistor SST, memory cells MC, and a drain select transistor DST. The source select transistor SST in each string SR may be coupled between the memory cells MC and a common source line CSL. The source select transistors SST in the plurality of strings SR may be coupled in common to the common source line CSL. The drain select transistor DST in each string SR may be coupled between the memory cells MC and the corresponding bit line BL. In each string SR, the plurality of memory cells MC may be provided between the source select transistor SST and the drain select transistor DST. In each string SR, the plurality of memory cells MC may be coupled in series to each other.

In the plurality of strings SR, corresponding memory cells MC disposed at the same sequential positions from the common source line CSL may be coupled in common to one word line. The memory cells MC in the plurality of strings SR may be coupled to a plurality of word lines WL1 to WLn.

The corresponding memory cells coupled to the same word line in the plurality of strings SR arranged in a row direction may constitute one page PAGE. For example, memory cells coupled to the first word line WL1 in the plurality of strings SR may constitute a first page PAGE 1. Memory cells coupled to the second word line WL2 may constitute a second page PAGE 2. Memory cells coupled to the third word line WL3 may constitute a third page PAGE 3. Memory cells coupled to the n-th word line WLn may constitute an n-th page PAGE n.

The memory device 100 may perform a program operation on selected memory cells in response to a program command from the memory controller 200. The program operation may be performed in units of pages corresponding to respective word lines WL1 to WLn.

In an embodiment, the program operation corresponding to the program command from the memory controller 200 may be sequentially performed on the plurality of pages depending on the locations of word lines corresponding to respective pages. For example, the memory controller 200 may select the first page PAGE 1 to the n-th page PAGE n as program target pages. The memory controller 200 may control the memory device 100 so that the program operation is sequentially performed on pages ranging from the first page PAGE 1 to the n-th page PAGE n.

The sequence of the program operation on the plurality of pages is not limited in this manner. The memory controller 200 may, for example, control the memory device 100 so that the program operation is sequentially performed in the sequence from the n-th page PAGE n to the first page PAGE 1.

Figure 13:
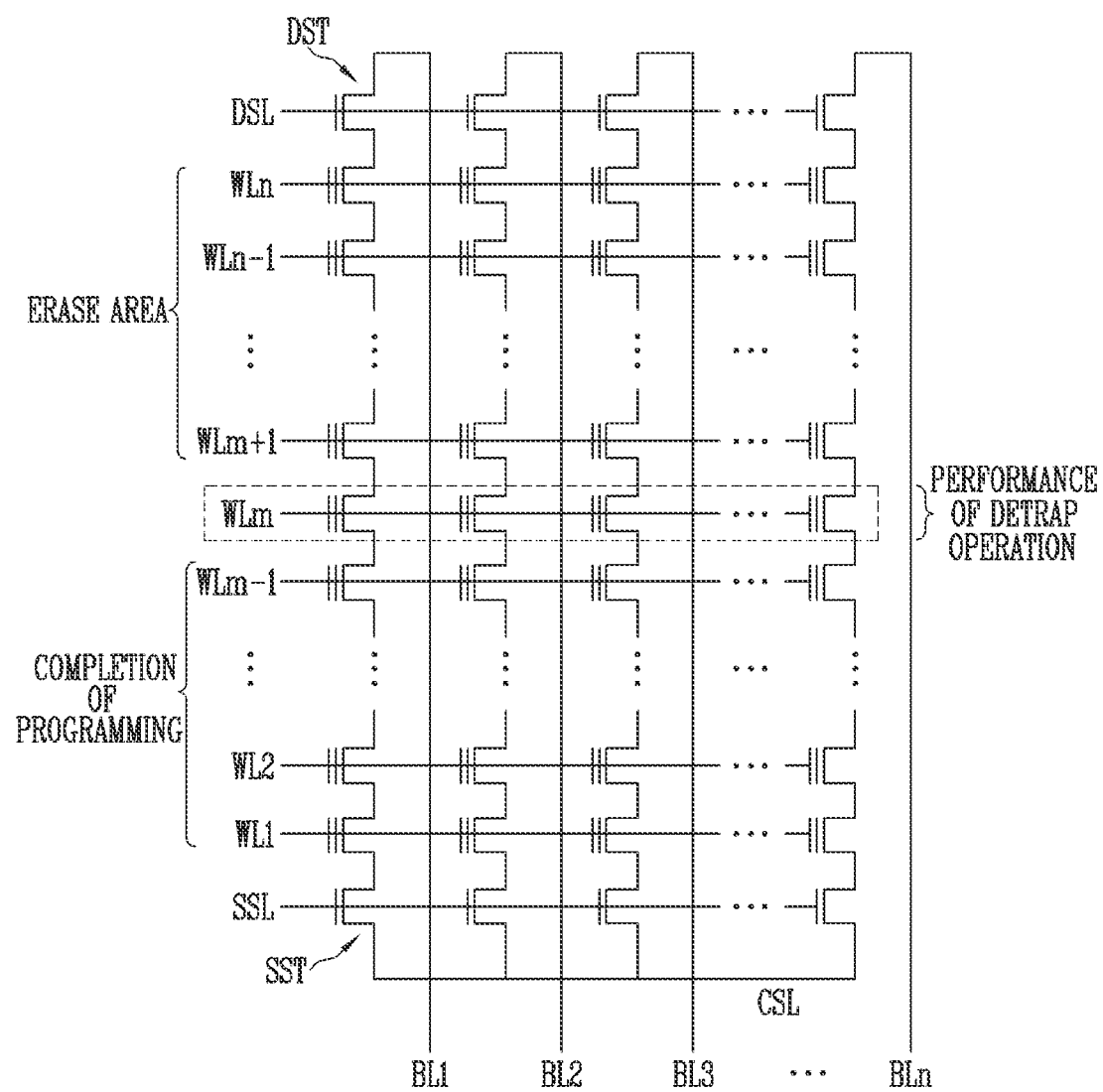
FIG. 13 is a diagram illustrating an example program operation according to an embodiment.

FIG. 13 is a diagram illustrating an example program operation according to an embodiment.

Referring to FIG. 13, memory cells coupled to word lines ranging from a first word line WL1 to an m−1-th word line WLm−1 may be memory cells for which the program operation has been completed. These word lines may be referred to as programmed word lines. The memory cells coupled to word lines ranging from an m+1-th word line WLm+1 to an n-th word line WLn may be memory cells for which a program operation has not yet been performed. These word lines may be referred to as unprogrammed word lines. Each of the memory cells coupled to word lines ranging from the m+1-th word line WLm+1 to the n-th word line WLn may be in an erased state.

Memory cells coupled to the m-th word line WLm may be memory cells selected as program target memory cells. The program operation on the selected memory cells may include two or more program steps. In an embodiment, the program operation may be performed in the sequence of a first program step, a detrap operation, and a second program step.

Figure 14:
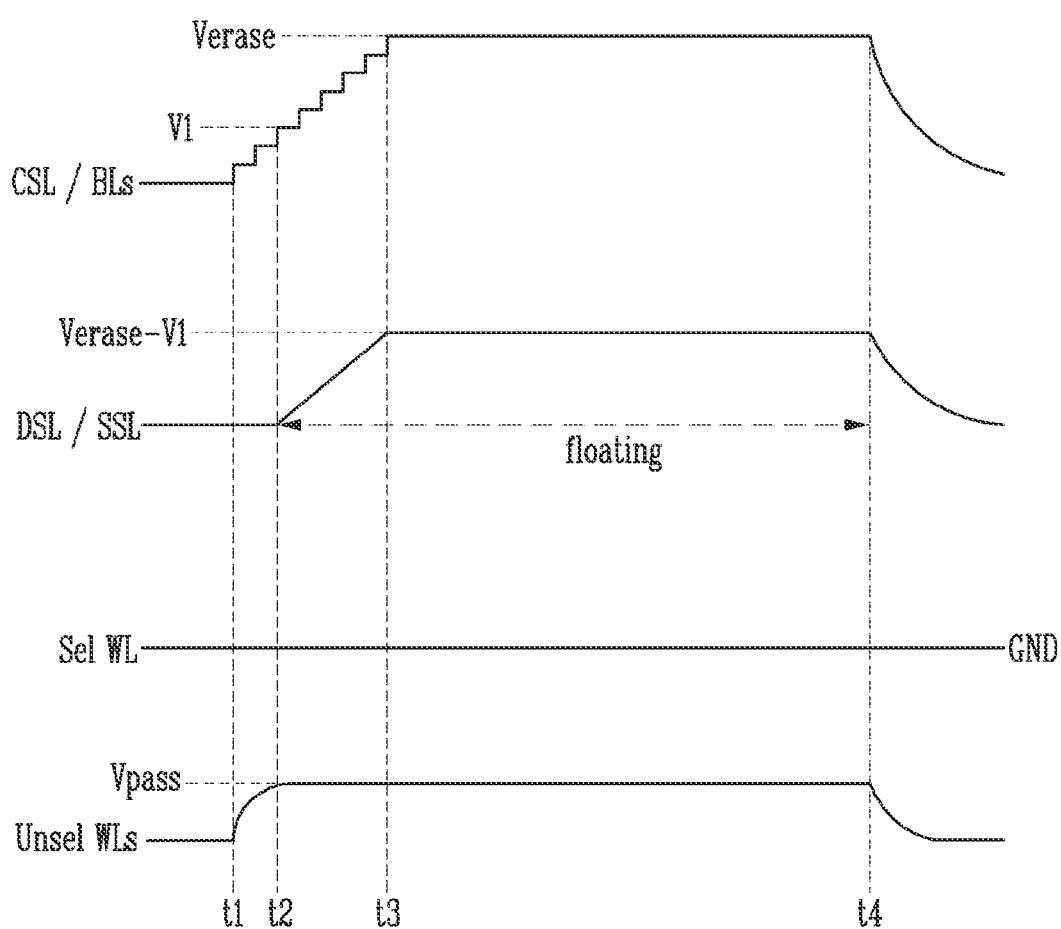
FIG. 14 is a timing diagram illustrating voltages applied to respective lines during an example detrap operation in the program operation of FIG. 13.

FIG. 14 is a timing diagram illustrating voltages applied to respective lines during an example detrap operation in the program operation of FIG. 13.

Referring to FIGS. 13 and 14, a selected word line may be represented by a label Sel WL of FIG. 14. The selected word line Sel WL may be word line on which the program operation is performed. The selected word line Sel WL may be the m-th word line WLm of FIG. 13. The remaining word lines of FIG. 13, which are unselected word lines, may be represented by the label Unsel WLs of FIG. 14. The unselected word lines Unsel WLs may be all word lines except the m-th word line WLm, which is the selected word line, among the plurality of word lines WL1 to WLn of FIG. 13.

At time t1, an erase voltage Verase may be applied to the common source line CSL and the plurality of bit lines BL1 to BLn, and a pass voltage Vpass may be applied to the unselected word lines Unsel WLs. In an example, the potential of the erase voltage applied to the common source line CSL and the plurality of bit lines BL1 to BLn may be increased in a stepped manner as shown. At time t1, a ground voltage may be applied to the selected word line Sel WL, the drain select line DSL, and the source select line SSL. Therefore, the drain select transistor DST and the source select transistor SST may be turned off. Since the drain select transistor DST and the source select transistor SST are turned off, current might not flow into the channel area of the memory cells.

At time t2, the potentials of the common source line CSL and the plurality of bit lines BL1 to BLn may reach V1. Here, a potential difference between the gate of the source select transistor SST and the common source line CSL may be V1. Also, a potential difference between the drain select transistor DST and the plurality of bit lines BL1 to BLn may also be V1. The magnitude of V1 may be the magnitude of voltage sufficient to generate a gate induced drain leakage (GIDL) current in the channel area of the source select transistor SST or the channel area of the drain select transistor DST.

When the potentials of the common source line CSL and the plurality of bit lines BL1 to BLn reach V1, the memory device 100 may control the drain select line DSL and the source select line SSL to float. When the drain select line DSL is floating, hot holes may be formed in the channel area of the drain select transistor DST due to the potential difference V1 between the gate of the drain select transistor DST and the plurality of bit lines BL1 to BLn. The formed hot holes may be shifted to the channel area of the plurality of memory cells MC. When the source select line SSL is floating, hot holes may be formed in the channel area of the source select transistor SST due to the potential difference V1 between the gate of the source select transistor SST and the common source line CSL. The formed hot holes may be shifted to the channel area of the plurality of memory cells MC. Accordingly, V1 may be considered to be a minimum voltage needed for forming hot holes in a channel area of the selected of the memory cells MC.

The potentials of the common source line CSL and the plurality of bit lines BL1 to BLn may increase from time t1, and may reach the erase voltage Verase at time t3. The potentials of the drain select line DSL and the source select line SSL may increase from time t2, which is a time point at which the drain select line DSL and the source select line SSL float. The increase in the potentials of the drain select line DSL and the source select line SSL may result from a coupling effect depending on the increase in the potentials of the plurality of bit lines BL1 to BLn and the common source line CSL. Therefore, from time t3, which is a time point at which the potentials of the plurality of bit lines BL1 to BLn and the common source line CSL reach the erase voltage Verase, the potentials of the drain select line DSL and the source select line SSL may no longer increase. Here, the magnitude of the potentials of the drain select line DSL and the source select line SSL may be equal to the difference between the magnitude of the erase voltage Verase and the magnitude of V1.

From time t3 to time t4, the potentials of the common source line CSL and the plurality of bit lines BL1 to BLn may be maintained at the magnitude of the erase voltage Verase. Here, the potentials of the drain select line DSL and the source select line SSL may be maintained at a magnitude equal to the difference between the magnitude of the erase voltage Verase and the magnitude of V1. From time t3 to time t4, the potential of the selected word line Sel WL may be maintained at the magnitude of the ground voltage, and the potential of the unselected word lines Unsel WLs may be maintained at the magnitude of the pass voltage Vpass.

From time t3 to time t4, a positive potential may be formed in the channel area of the plurality of memory cells due to hot holes shifted to the channel area of the memory cells. In this case, electrons trapped in the charge trap layer for the selected memory cells may be detrapped due to a potential difference between the word line and the channel area of the selected memory cells. Therefore, the magnitudes of the threshold voltages of the selected memory cells may be decreased. That is, as described above with reference to FIG. 9, the threshold voltage distribution of the selected memory cells may be shifted to the left. Since the pass voltage Vpass is applied to the unselected word lines Unsel WLs, a potential difference between the unselected word lines Unsel WLs and the channel area might not be sufficient to detrap the electrons trapped in the charge trap layer. Therefore, the electrons trapped in the charge trap layer for the memory cells coupled to the unselected word lines Unsel WLs might not be detrapped.

As described above with respect to FIGS. 13 and 14, some of the electrons trapped in the charge trap layer for the memory cells coupled to the selected word line Sel WL may be detrapped. The number of electrons detrapped, among the electrons trapped in the charge trap layer, may be adjusted depending on the magnitude of the erase voltage Verase and/or the time during which the erase voltage Verase is applied.

Figure 15:
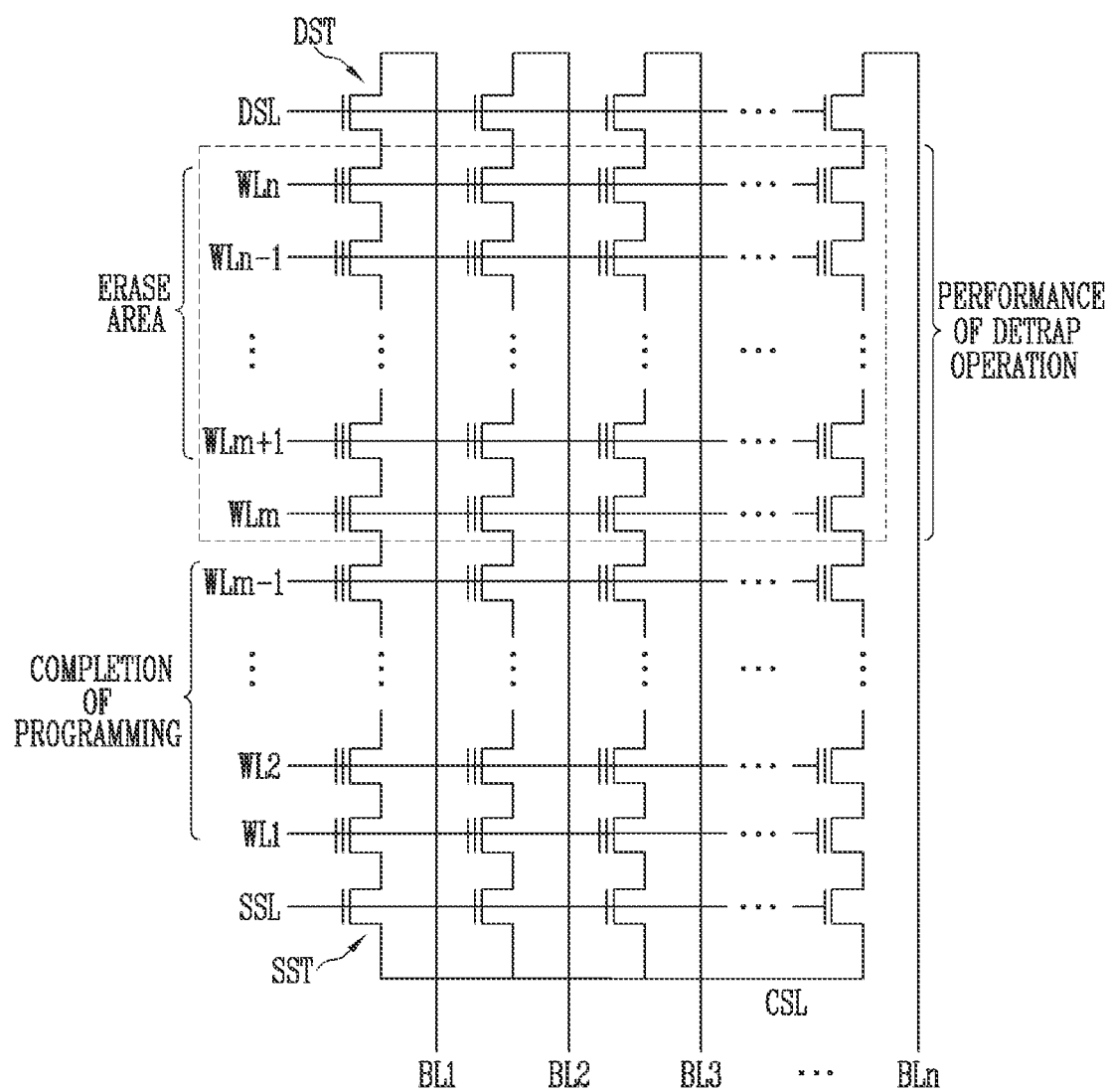
FIG. 15 is a diagram illustrating an example program operation according to an embodiment.

FIG. 15 is a diagram illustrating an example program operation according to an embodiment.

Referring to FIG. 15, memory cells coupled to word lines ranging from a first word line WL1 to an m−1-th word line WLm−1 may be memory cells for which the program operation has been completed. These word lines may be referred to as programmed word lines. The memory cells coupled to word lines ranging from an m+1-th word line WLm+1 to an n-th word line WLn may be memory cells on which a program operation has not yet been performed. These word lines may be referred to as unprogrammed word lines. Each of the memory cells coupled to word lines ranging from the m+1-th word line WLm+1 to the n-th word line WLn may be in an erased state.

Apart from the embodiment of FIG. 13 in which a detrap operation is performed only on the memory cells coupled to the selected word line WLm, the embodiment of FIG. 15 is configured such that a detrap operation may also be performed on memory cells included in an erase area, together with the memory cells coupled to the selected word line WLm. The memory cells included in the erase area may be in an erased state. As illustrated above with reference to FIG. 6, a pass voltage may be applied to unselected word lines while a program voltage is being applied to selected memory cells. There may occur during a program operation a disturbance phenomenon in which electrons are unintentionally trapped in a charge trap layer. This may occur for memory cells coupled to unselected word lines due to the pass voltage applied to the unselected word lines. Therefore, after the first program step has been completed, a detrap operation may be performed on the memory cells included in the erase area along with the program operation. This may enable detrapping of the electrons unintentionally trapped in the charge trap layer for the memory cells in the erase area while the program operation is being performed.

Figure 16:
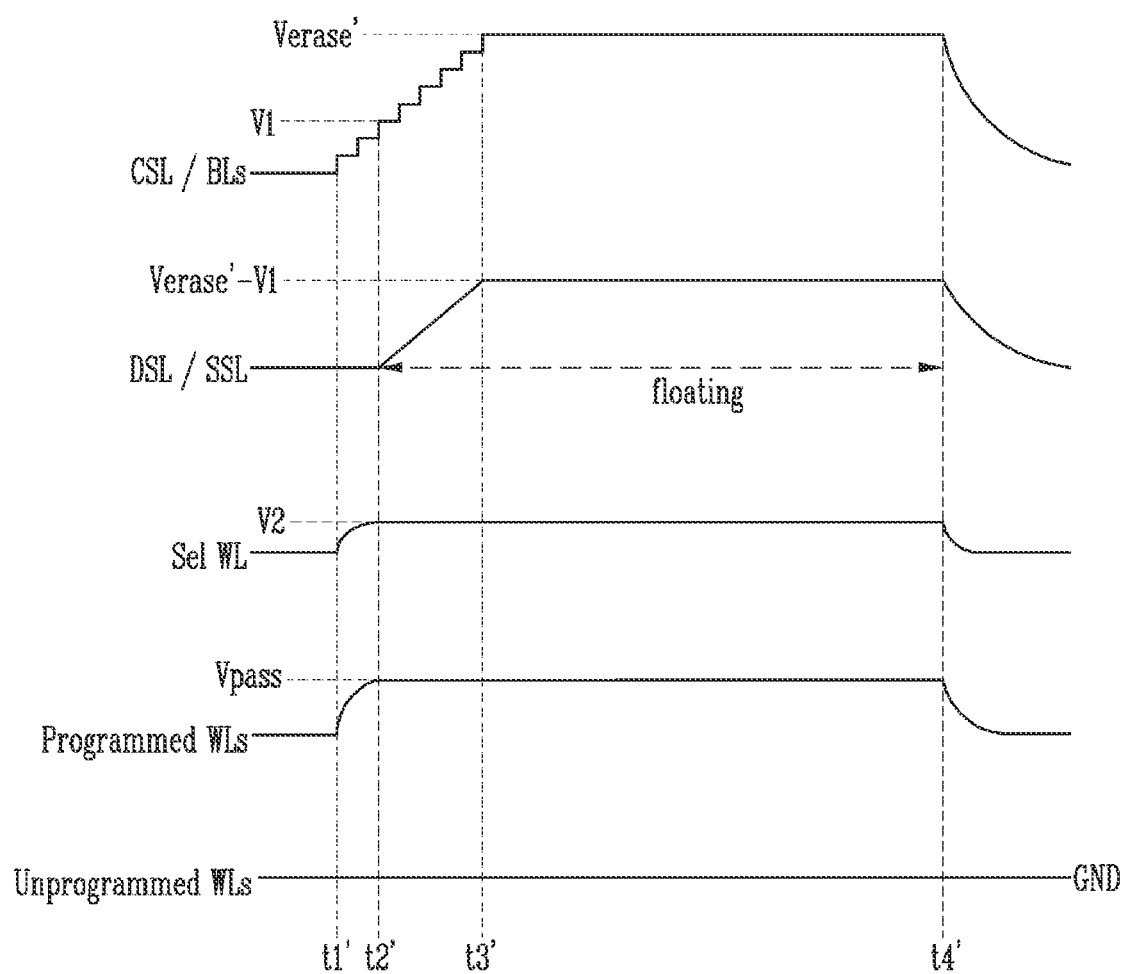
FIG. 16 is a timing diagram illustrating voltages applied to respective lines during an example detrap operation in the program operation of FIG. 15.

FIG. 16 is a timing diagram illustrating voltages applied to respective lines during an example detrap operation in the program operation of FIG. 15.

Referring to FIGS. 15 and 16, a selected word line represented by label Sel WL of FIG. 16 may be a word line coupled to memory cells on which the program operation is performed. The selected word line Sel WL may be the m-th word line WLm of FIG. 15. Programmed word lines represented by label Programmed WLs of FIG. 16 may be word lines ranging from a first word line WL1 to an m−1-th word line WLm−1, among a plurality of word lines WL1 to WLn. Unprogrammed word lines represented by label Unprogrammed WLs of FIG. 16 may be word lines ranging from the m+1-th word line WLm+1 to the n-th word line WLn, among the plurality of word lines WL1 to WLn of FIG. 15.

At time t1', an erase voltage Verase' may be applied to a common source line CSL and a plurality of bit lines BL1 to BLn, a pass voltage Vpass may be applied to the programmed word lines Programmed WLs, and V2 may be applied to the selected word line Sel WL. A ground voltage may be applied to a drain select line DSL, a source select line SSL, and the unprogrammed word lines Unprogrammed WLs. V2 may be a voltage for making the difference between the extent to which electrons trapped in the charge trap layer for selected memory cells are detrapped and the extent to which electrons trapped in a charge trap layer for memory cells included in an erase area are detrapped while the detrap operation is being performed. However, this is not limited to the present embodiment, and the ground voltage may also be applied to the selected word line Sel WL.

At time t1', a drain select transistor DST and a source select transistor SST may be turned off. Since the drain select transistor DST and the source select transistor SST are turned off, current might not flow into the channel area of the memory cells.

At time t2', the potentials of the common source line CSL and the plurality of bit lines BL1 to BLn may reach V1. Here, a potential difference between the gate of the source select transistor SST and the common source line CSL may be V1. Also, a potential difference between the drain select transistor DST and the plurality of bit lines BL1 to BLn may also be V1. The magnitude of V1 may be the magnitude of voltage sufficient to generate a gate induced drain leakage (GIDL) current in the channel area of the source select transistor SST or the channel area of the drain select transistor DST.

When the potentials of the common source line CSL and the plurality of bit lines BL1 to BLn reach V1, the memory device 100 may control the drain select line DSL and the source select line SSL to float.

The potentials of the common source line CSL and the plurality of bit lines BL1 to BLn may increase from time t1, and may reach the erase voltage Verase' at time t3'. The potentials of the drain select line DSL and the source select line SSL may increase from time t2, which is a time point at which the drain select line DSL and the source select line SSL float. From time t3', which is a time point at which the potentials of the plurality of bit lines BL1 to BLn and the common source line CSL reach the erase voltage Verase, the potentials of the drain select line DSL and the source select line SSL may no longer increase. Here, the magnitude of the potentials of the drain select line DSL and the source select line SSL may be equal to the difference between the magnitude of the erase voltage Verase' and the magnitude of V1.

From time t3' to time t4', the potentials of the common source line CSL and the plurality of bit lines BL1 to BLn may be maintained at the magnitude of the erase voltage Verase'. Here, the potentials of the drain select line DSL and the source select line SSL may be maintained at a magnitude equal to the difference between the magnitude of the erase voltage Verase' and the magnitude of V1. From time t3' to time t4', the potential of the selected word line Sel WL may be maintained at V2, and the potentials of the programmed word lines Programmed WLs may be maintained at the magnitude of the pass voltage. From time t3' to time t4' the potentials of the unprogrammed word lines Unprogrammed WLs may be maintained at the magnitude of the ground voltage.

From time t3' to time t4', a positive potential may be formed in the channel area of the plurality of memory cells due to hot holes shifted to the channel area of the memory cells. In this case, electrons trapped in the charge trap layer for the selected memory cells may be detrapped due to a potential difference between the word line and the channel area of the selected memory cells.

From time t3' to time t4', the potentials of the unprogrammed word lines Unprogrammed WLs are maintained at the ground voltage, and thus the electrons trapped in the charge trap layer for the memory cells included in the erase area may be detrapped due to the difference between the potentials of the unprogrammed word lines Unprogrammed WLs and the potential of the channel area.

Since the pass voltage is applied to the programmed word lines Programmed WLs, a potential difference between the programmed word lines Programmed WLs and the channel area might not be sufficient to detrap the electrons trapped in the charge trap layer. Therefore, the electrons trapped in the charge trap layer for the memory cells coupled to the programmed word lines Programmed WLs might not be detrapped.

As described above with respect to FIGS. 15 and 16, some of the electrons trapped in the charge trap layers for the memory cells coupled to the selected word line Sel WL and for the memory cells included in the erase area may be detrapped. The number of electrons to be detrapped, among the electrons trapped in the charge trap layer, may be adjusted depending on the magnitude of the erase voltage Verase' and/or the time during which the erase voltage Verase' is applied.

Figure 17:
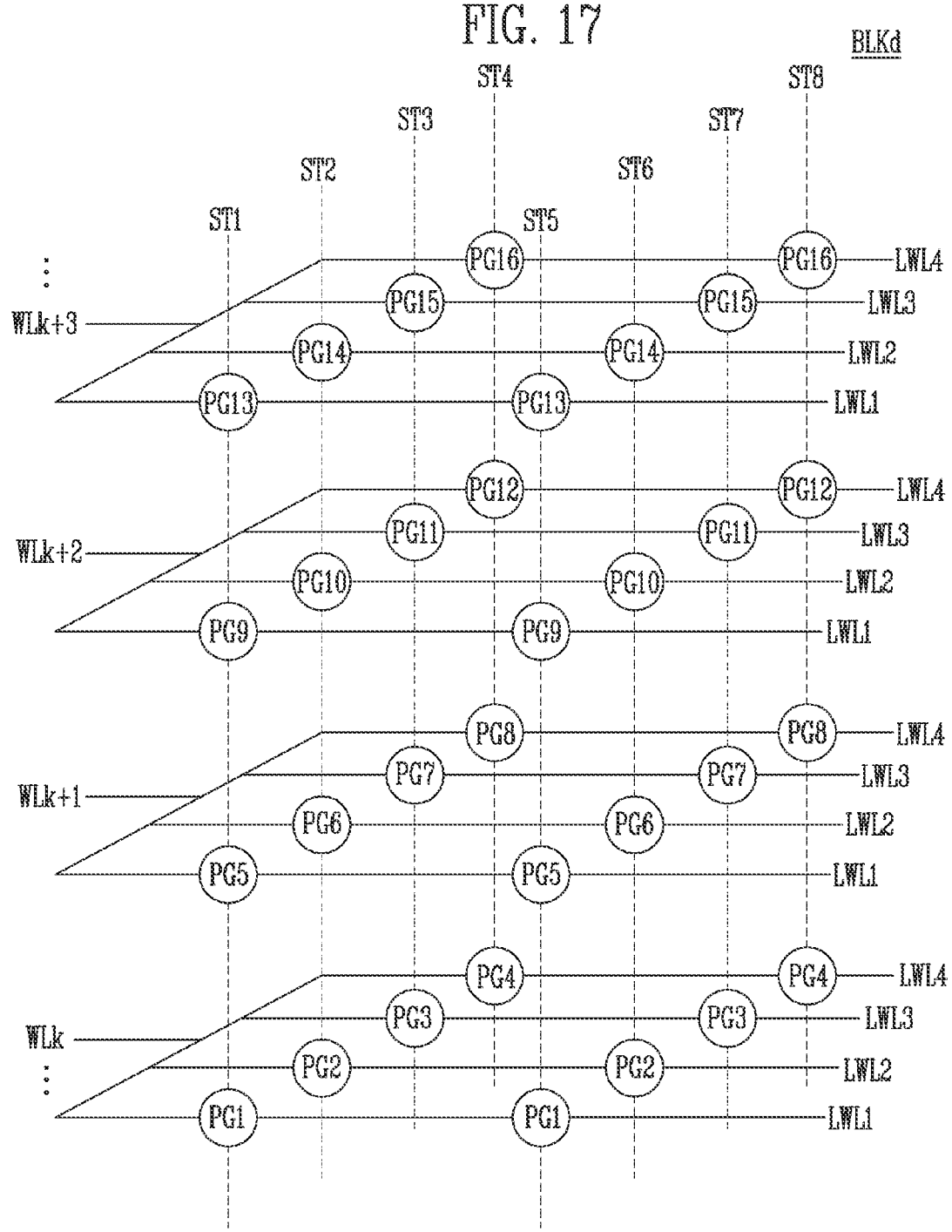
FIG. 17 is a circuit diagram illustrating an example memory block BLKd of the memory blocks BLK1 to BLKz of FIG. 2.

FIG. 17 is a circuit diagram illustrating an example memory block BLKd of the memory blocks BLK1 to BLKz of FIG. 2.

Referring to FIG. 17, the memory block BLKd may be coupled to a plurality of physical word lines. One physical word line may be coupled in common to four logical word lines. Memory cells coupled to any one of the logical word lines may constitute one page. For example, each of a k-th physical word line WLk to a k+3-th physical word line WLk+3 may be coupled in common to first to fourth logical word lines LWL1 to LWL4.

In an embodiment, first to fourth strings ST1 to ST4 may be coupled in common to the same bit line. Fifth to eighth strings ST5 to ST8 may be coupled in common to the same bit line.

In FIG. 17, although a structure in which four strings included in one memory block are coupled to the same bit line is described as an example, this is only for convenience of description, and the number of strings coupled in common to the same bit line may be less than or greater than 4.

In detail, the number of logical word lines coupled to one physical word line may depend on the number of strings coupled in common to one bit line. For example, when five strings are coupled in common to one bit line, one physical word line may be coupled in common to five logical word lines. In this case, one physical word line may include five pages. Among the five pages, the string to be programmed, or any other string(s), may be determined based on string select signals (e.g., signals applied to the drain select line or the source select line of FIG. 4 or 5).

The first logical word line LWL1 may be selected by the first string ST1 and the fifth string ST5. The second logical word line LWL2 may be selected by the second string ST2 and the sixth string ST6. The third logical word line LWL3 may be selected by the third string ST3 and the seventh string ST7. The fourth logical word line LWL4 may be selected by the fourth string ST4 and the eighth string ST8. Accordingly, a particular page may be specified by one logical word line and one physical word line.

That is, the k-th physical word line WLk may include first to fourth pages PG1 to PG4. A k+1-th physical word line WLk+1 may include fifth to eighth pages PG5 to PG8. A k+2-th physical word line WLk+2 may include ninth to twelfth pages PG9 to PG12. A k+3-th physical word line WLk+3 may include thirteenth to sixteenth pages PG13 to PG16.

In an embodiment, strings coupled to the same logical word line may form one string group. For example, because the first string ST1 and the fifth string ST5 are coupled to the first logical word line LWL1, a first string group may be formed. Because the second string ST2 and the sixth string ST6 are coupled to the second logical word line LWL2, a second string group may be formed. Because the third string ST3 and the seventh string ST7 are coupled to the third logical word line LWL3, a third string group may be formed. Because the fourth string ST4 and the eighth string ST8 are coupled to the fourth logical word line LWL4, a fourth string group may be formed.

In an embodiment, the program operation may be performed on a page basis. For example, the memory device 100 may sequentially perform a program operation in the sequence from the pages included in the k-th physical word line WLk under the control of the memory controller 200. For example, the memory device 100 may first perform a program operation on the first page PG1, among the pages included in the k-th physical word line WLk. When the program operation performed on the first page PG1 is completed, a program operation may be performed on the second page PG2. When the program operation performed on the second page PG2 is completed, a program operation may be performed on the third page PG3. When the program operation performed on the third page PG3 is completed, a program operation may be performed on the fourth page PG4.

When the program operation performed on all pages PG1 to PG4 coupled to the k-th physical word line WLk is completed, a program operation may be performed on pages coupled to the k+1-th word line WLk+1.

In an embodiment, the program operation may include two or more program steps. For example, the program operation may include a first program step and a second program step. After the first program step has been completed, a detrap operation may be performed on the selected memory cells. When the detrap operation performed on the selected memory cells is completed, a second program step may be performed on the selected memory cells.

Figure 18:
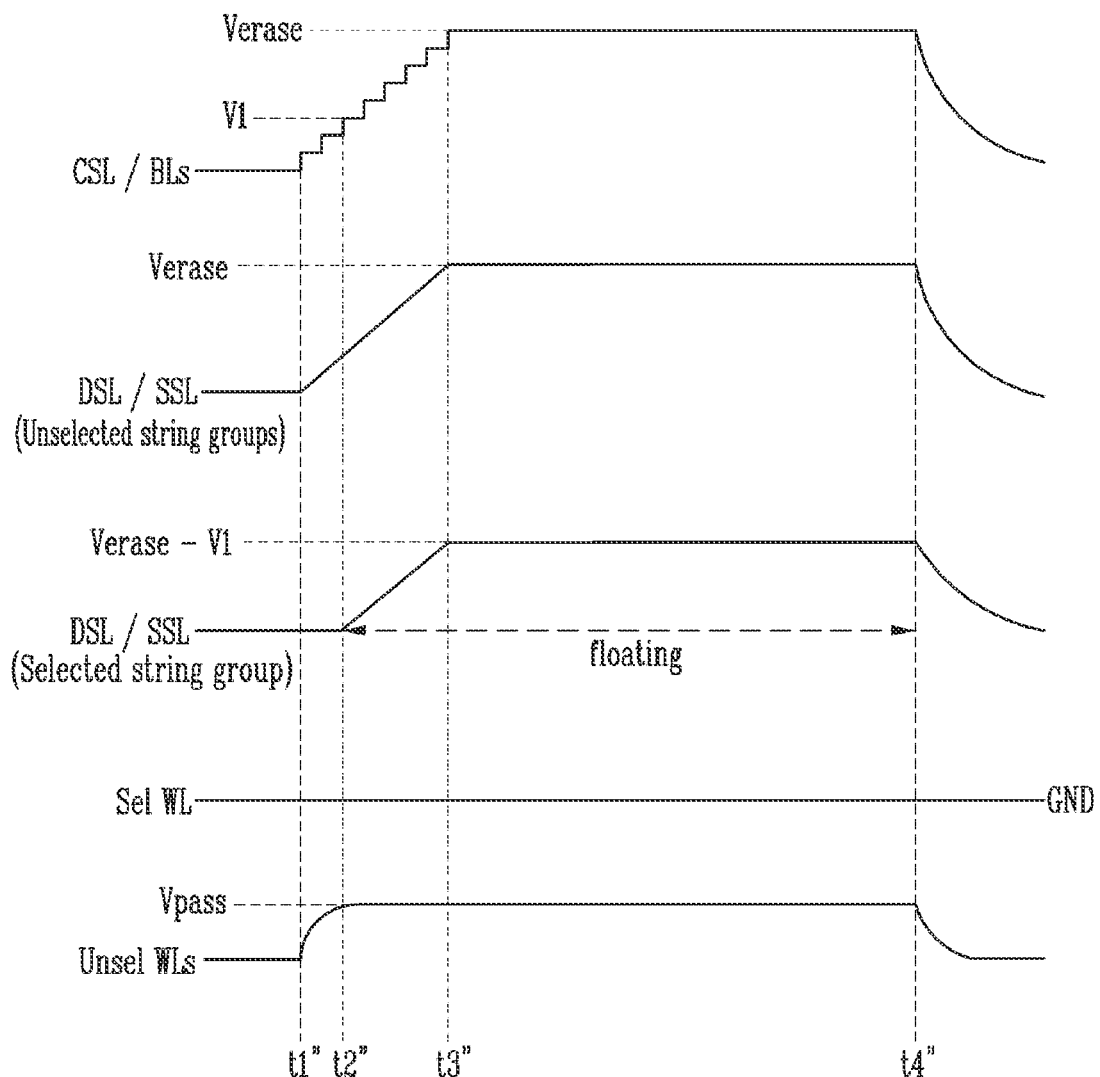
FIG. 18 is a timing diagram illustrating voltages applied to respective lines during an example detrap operation in the program operation of FIG. 17.

FIG. 18 is a timing diagram illustrating voltages applied to respective lines during an example detrap operation in the program operation of FIG. 17.

Although not illustrated in FIGS. 17 and 18, the plurality of memory cells described above with reference to FIG. 17 may be coupled between the common source line CSL and the plurality of bit lines BLs. For example, in the same manner as that described with reference to FIG. 5, a plurality of strings, each including a plurality of memory cells, may be coupled to a common source line and a plurality of bit lines BLs.

Referring to FIGS. 17 and 18, a selected word line represented by label Sel WL of FIG. 18 may be a word line coupled to memory cells on which the program operation is performed. The selected word line Sel WL may be the k-th physical word line WLk of FIG. 17. Unselected word lines represented by label Unsel WLs of FIG. 18 may be all word lines except the k-th physical word line WLk, which is a physical word line selected from among the plurality of physical word lines of FIG. 17.

At time t1", an erase voltage Verase may be applied to the common source line CSL and the plurality of bit lines BLs, and a pass voltage Vpass may be applied to the unselected word lines Unsel WLs. In an example, the potential of the erase voltage applied to the common source line CSL and the plurality of bit lines BL1 to BLn may be increased in a stepped manner as shown. At time t1", a ground voltage may be applied to the selected word line Sel WL, and a pass voltage may be applied to the unselected word lines Unsel WLs.

At time t1", the ground voltage may be applied to a drain select line DSL and a source select line SSL coupled to strings included in a selected string group. In an embodiment, the selected string group may be the first string group. The first string group may include the first string ST1 and the fifth string ST5.

At time t1", drain select lines DSL and source select lines SSL coupled to strings included in unselected string groups may float. In an embodiment, the unselected string groups may be the second to fourth string groups. The second string group may include the second string ST2 and the sixth string ST6. The third string group may include the third string ST3 and the seventh string ST7. The fourth string group may include the fourth string ST4 and the eighth string ST8. The potentials of the drain select lines DSL and the source select lines SSL coupled to the strings included in the unselected string groups may increase from time t1″, which is the time point at which the drain select lines DSL and the source select lines SSL float. The increase in the potentials of the drain select line DSL and the source select line SSL may result from a coupling effect depending on the increase in the potentials of the plurality of bit lines BLs and the common source line CSL.

At time t2″, the potentials of the common source line CSL and the plurality of bit lines BLs may reach V1. Here, a potential difference between gates of source select transistors SST coupled to the selected string group and the common source line CSL may be V1. Further, a potential difference between the drain select transistors DST coupled to the selected string group and the plurality of bit lines BLs may also be V1. The magnitude of V1 may be the magnitude of voltage sufficient to generate a gate induced drain leakage (GIDL) current in the channel area of the source select transistor SST or the channel area of the drain select transistor DST.

The potentials of the common source line CSL and the plurality of bit lines BLs may increase from time t1″, and may reach the erase voltage Verase at time t3″. The potentials of the drain select line DSL and the source select line SSL of the selected string group may increase from time t2″, which is a time point at which the drain select line DSL and the source select line SSL float. The increase in the potentials of the drain select line DSL and the source select line SSL of the selected string group may result from a coupling effect depending on the increase in the potentials of the plurality of bit lines BLs and the common source line CSL. Therefore, from time t3″, which is a time point at which the potentials of the plurality of bit lines BLs and the common source line CSL reach the erase voltage Verase, the potentials of the drain select line DSL and the source select line SSL may no longer increase. Here, the magnitude of the potentials of the drain select line DSL and the source select line SSL of the selected string group may be equal to the difference between the magnitude of the erase voltage Verase and the magnitude of V1. Because the potentials of the drain select lines DSL and the source select lines SSL of the unselected string groups increase from time t1″, the potentials may be equal to the magnitude of the erase voltage Verase.

From time t3″ to time t4″, the potentials of the common source line CSL and the plurality of bit lines BLs may be maintained at the magnitude of the erase voltage Verase. Here, the potentials of the drain select line DSL and the source select line SSL of the selected string group may be maintained at a magnitude equal to the difference between the magnitude of the erase voltage Verase and the magnitude of V1. The potentials of the drain select lines DSL and the source select lines SSL of the unselected string groups may be maintained at the same magnitude as the erase voltage Verase. From time t3″ to time t4″, the potential of the selected word line Sel WL may be maintained at the magnitude of the ground voltage, and the potentials of the unselected word lines Unsel WLs may be maintained at the magnitude of the pass voltage Vpass.

From time t3″ to time t4″, a potential may be formed in the channel area of the plurality of memory cells included in the selected string group due to hot holes shifted to the channel area of the memory cells included in the selected string group. In this case, electrons trapped in the charge trap layer for the selected memory cells may be detrapped due to a potential difference between the word line and the channel area of the selected memory cells. Since the pass voltage Vpass is applied to the unselected word lines Unsel WLs, a potential difference between the unselected word lines Unsel WLs and the channel area might not be sufficient to detrap the electrons trapped in the charge trap layer. Therefore, the electrons trapped in the charge trap layer for the memory cells coupled to the unselected word lines Unsel WLs might not be detrapped.

From time t1″ to time t4″, the potentials of the drain select lines DSL and the source select lines SSL of the unselected string groups may be equal to those of the common source line CSL and the plurality of bit lines BLs. Therefore, a gate induced drain leakage (GIDL) current might not be generated in the channel areas of the drain select transistors DST and the source select transistors SST of the unselected string groups. Therefore, electrons trapped in the charge trap layer for the memory cells included in the unselected string groups might not be detrapped.

As described above with reference to FIGS. 17 and 18, a detrap operation may be performed on a page selected from among the plurality of pages included in the selected physical word line Sel WL.

Figure 19:
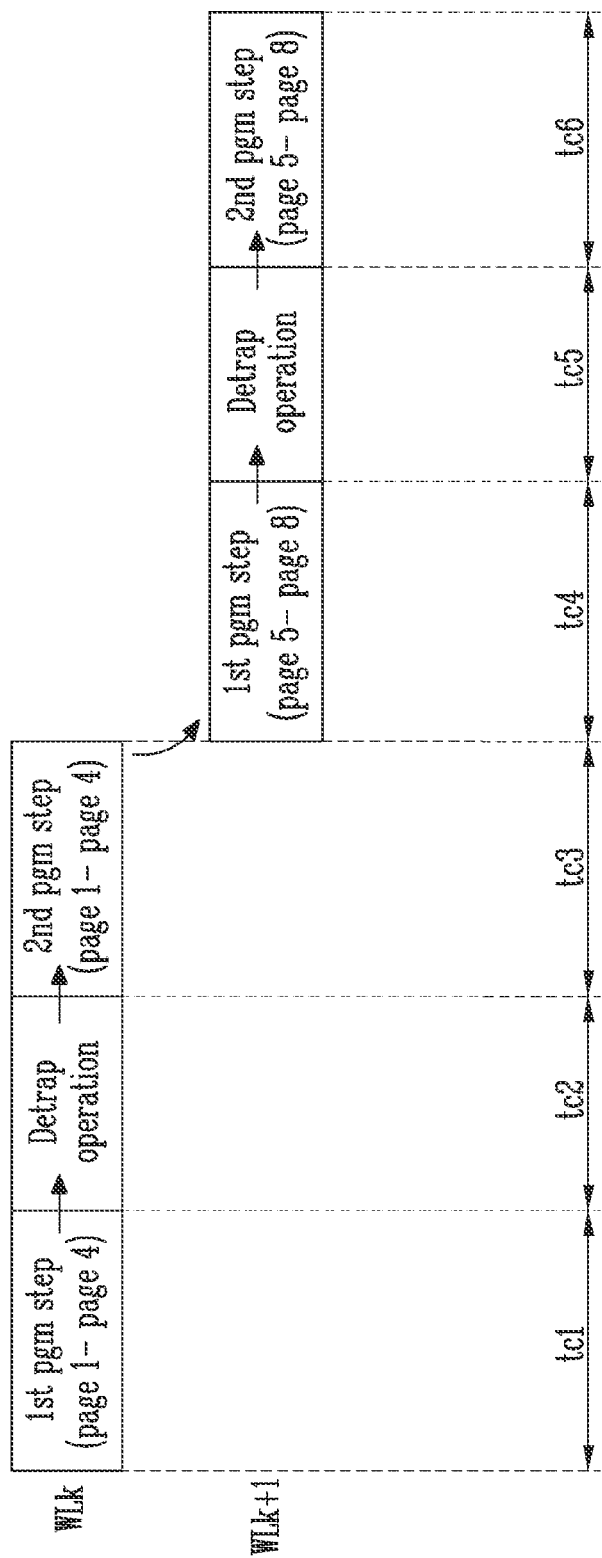
FIG. 19 is a diagram illustrating an example sequence of a program operation according to an embodiment.

FIG. 19 is a diagram illustrating an example sequence of a program operation according to an embodiment.

Referring to FIGS. 17 and 19, the memory device 100 may perform a first program step on the plurality of pages PG1 to PG4 included in the k-th physical word line WLk for a time tc1 under the control of the memory controller 200. When the first program step is completed, a detrap operation may be performed on the plurality of pages PG1 to PG4 included in the k-th physical word line WLk for a time tc2. When the detrap operation is completed, a second program step may be performed on the plurality of pages PG1 to PG4 included in the k-th physical word line WLk for a time tc3.

When the second program step performed on the plurality of pages PG1 to PG4 included in the k-th physical word line WLk is completed, the memory device 100 may perform a first program step on the plurality of pages PG5 to PG8 included in the k+1-th physical word line WLk+1 for a time tc4 under the control of the memory controller 200. When the first program step is completed, a detrap operation may be performed on the plurality of pages PG5 to PG8 included in the k+1-th physical word line WLk+1 for a time tc5. When the detrap operation is completed, a second program step may be performed on the plurality of pages PG5 to PG8 included in the k+1-th physical word line WLk+1 for a time tc6.

Figure 20:
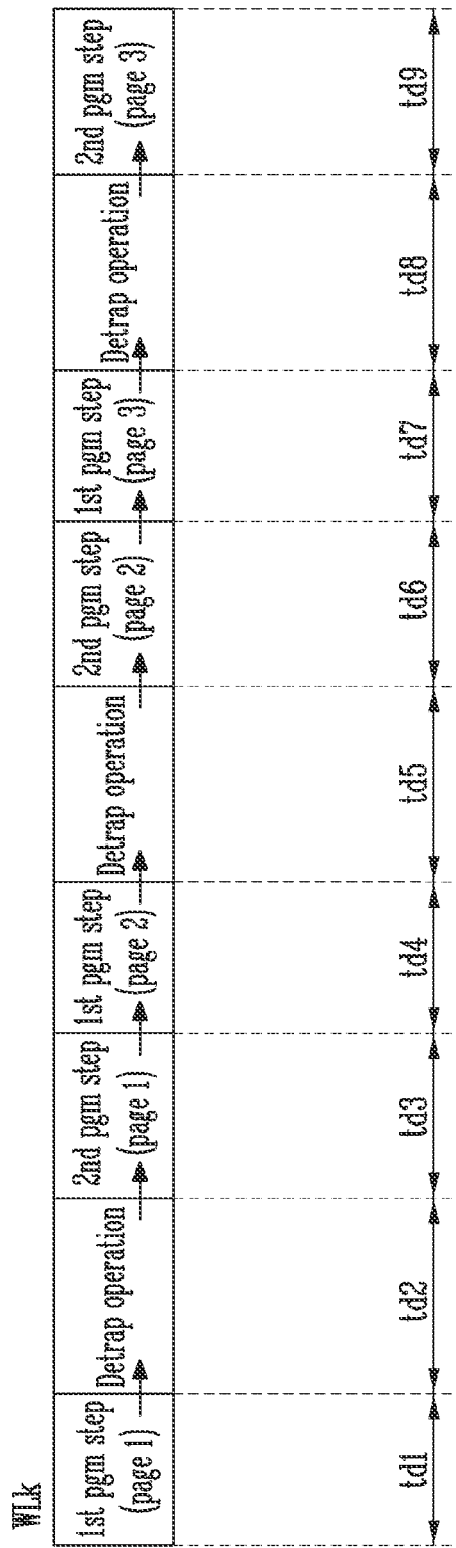
FIG. 20 is a diagram illustrating an example sequence of a program operation according to an embodiment.

FIG. 20 is a diagram illustrating an example sequence of a program operation according to an embodiment.

Referring to FIGS. 17 and 20, the memory device 100 may perform a detrap operation on each selected page.

For example, the memory device 100 may perform a first program step on the first page PG1, among the plurality of pages PG1 to PG4 included in the k-th physical word line WLk, for a time td1 under the control of the memory controller 200. When the first program step performed on the first page PG1 is completed, a detrap operation may be performed on the first page PG1 for a time td2. When the detrap operation performed on the first page PG1 is completed, a second program step may be performed on the first page PG1 for a time td3.

The memory device 100 may perform a first program step on the second page PG2, among the plurality of pages PG1 to PG4 included in the k-th physical word line WLk, for a time td4 under the control of the memory controller 200. When the first program step performed on the second page PG2 is completed, a detrap operation may be performed on the second page PG2 for a time td5. When the detrap operation performed on the second page PG2 is completed, a second program step may be performed on the second page PG2 for a time td6.

When the second program step performed on the second page PG2 is completed, a first program step, a detrap operation, and a second program step may be sequentially performed on the third page for times td7 to td9. That is, in an embodiment, the first program step, the detrap operation, and the second program step may be performed on each page.

Figure 21:
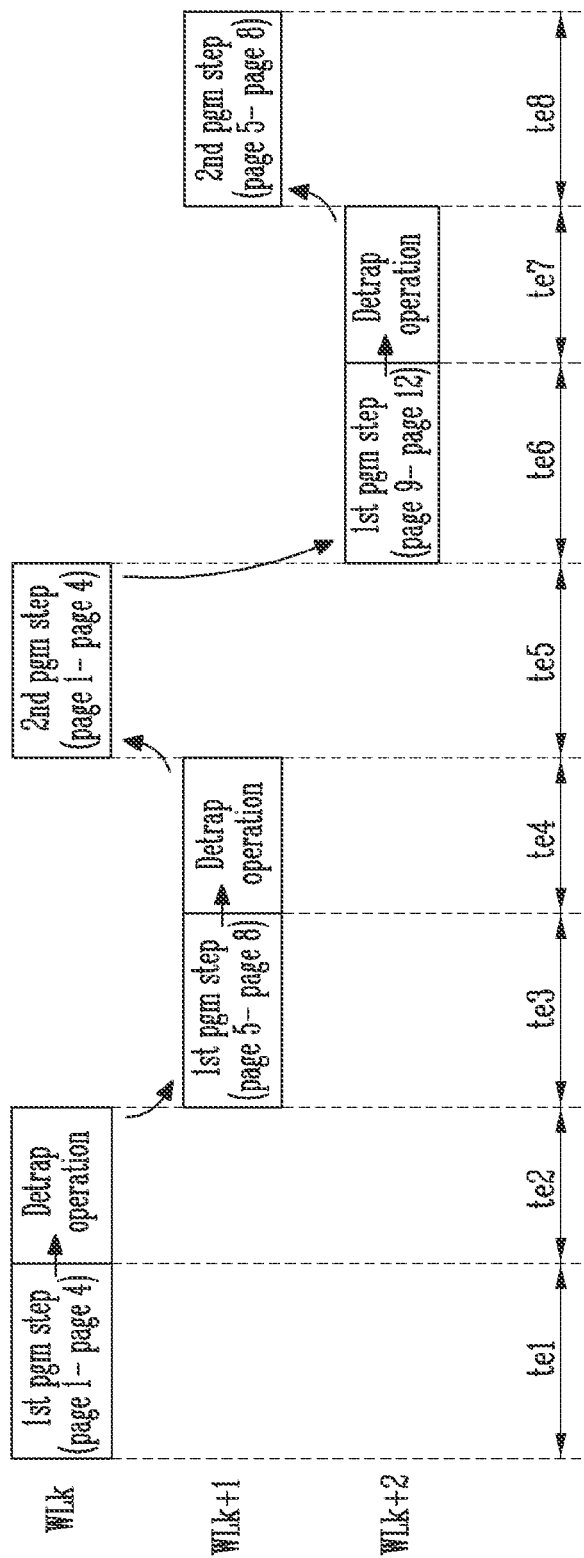
FIG. 21 is a diagram illustrating an example sequence of a program operation according to an embodiment.

FIG. 21 is a diagram illustrating an example sequence of a program operation according to an embodiment.

Referring to FIGS. 17 and 21, the memory device 100 may alternately perform a first program step and a second program step on pages coupled to adjacent physical word lines. In detail, the memory device 100 may perform a first program step and a detrap operation on a plurality of pages included in the selected physical word line, and may thereafter perform a first program step and a detrap operation on a plurality of pages included in a subsequent physical word line to be selected.

For example, the memory device 100 may perform a first program step on the plurality of pages PG1 to PG4 included in the k-th physical word line WLk for a time te1 under the control of a memory controller 200. When the first program step is completed, a detrap operation may be performed on the plurality of pages PG1 to PG4 included in the k-th physical word line WLk for a time te2. When the detrap operation performed on the plurality of pages PG1 to PG4 included in the k-th physical word line WLk is completed, a first program step may be performed on the plurality of pages PG5 to PG8 included in the adjacent k+1-th physical word line WLk+1 for a time te3. When the first program step performed on the plurality of pages PG5 to PG8 included in the k+1-th physical word line WLk+1 is completed, a detrap operation may be performed on the plurality of pages PG5 to PG8 included in the k+1-th physical word line WLk+1 for a time te4. The k-th physical word line WLk is adjacent to the k+1-th physical word line WLk+1. When the detrap operation performed on the plurality of pages PG5 to PG8 included in the k+1-th physical word line WLk+1 is completed, a second program step may be performed on the plurality of pages PG1 to PG4 included in the adjacent k-th physical word line WLk for a time te5. When the second program step performed on the plurality of pages PG1 to PG4 included in the k-th physical word line WLk is completed, a first program step may be performed on the plurality of pages PG9 to PG12 included in the k+2-th physical word line WLk+2 for a time te6. The k+2-th physical word line WLk+2 is adjacent to the k+1-th physical word line WLk+1. When the first program step performed on the plurality of pages PG9 to PG12 included in the k+2-th physical word line WLk+2 is completed, a detrap operation may be performed on the plurality of pages PG9 to PG12 included in the k+2-th physical word line WLk+2 for a time te7. When the detrap operation performed on the plurality of pages PG9 to PG12 included in the k+2-th physical word line WLk+2 is completed, a second program step may be performed on the plurality of pages PG5 to PG8 included in the adjacent k+1-th physical word line WLk+1 for a time te8. Although not shown, after the second program step is completed on the plurality of pages PG5 to PG8 included in the k+1-th physical word line WLk+1, a second program step may be completed on the plurality of pages PG9 to PG12 included in the k+2-th physical word line WLk+2.

Figure 22:
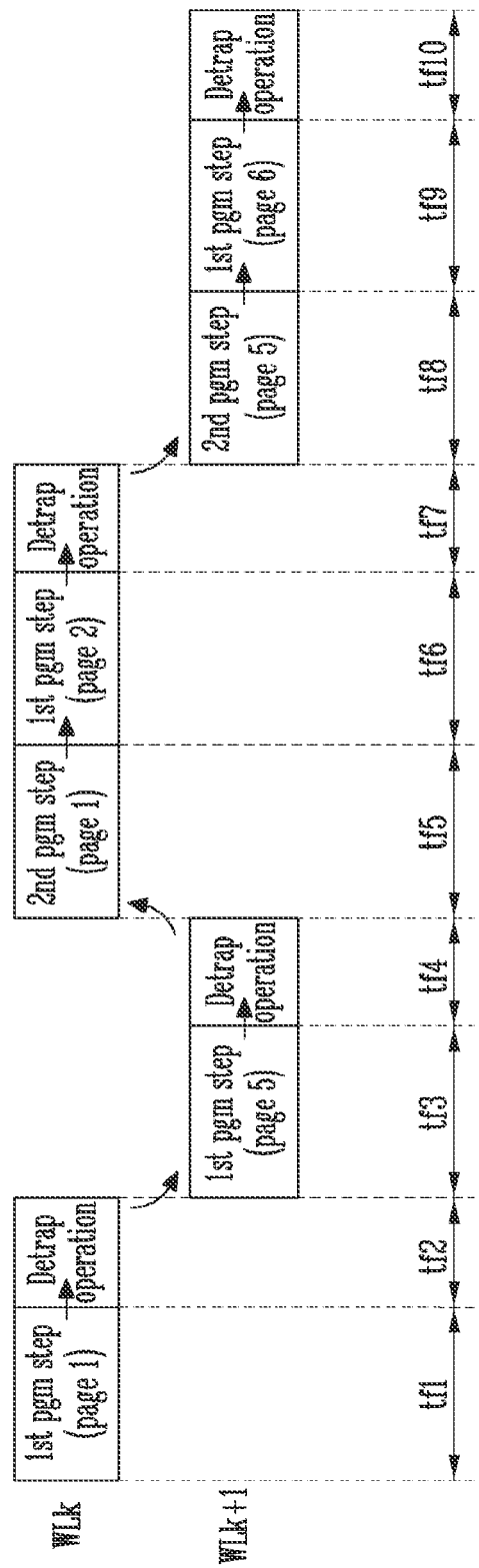
FIG. 22 is a diagram illustrating an example sequence of a program operation according to an embodiment.

FIG. 22 is a diagram illustrating an example sequence of a program operation according to an embodiment.

Referring to FIGS. 17 and 22, the memory device 100 may alternately perform a first program step and a second program step on adjacent pages. In detail, the memory device 100 may perform a first program step and a detrap operation on selected pages, and may thereafter perform a first program step and a detrap operation on subsequent pages to be selected.

For example, the memory device 100 may first perform a first program step on the first page PG1 included in the k-th physical word line WLk for a time tf1. The memory device 100 may perform a detrap operation on the first page PG1 for a time tf2.

When the detrap operation performed on the first page PG1 included in the k-th physical word line WLk is completed, a first program step may be performed on the adjacent fifth page PG5 included in the k+1-th physical word line WLk+1 for a time tf3. The memory device 100 may perform a detrap operation on the fifth page PG5 for a time tf4.

When the detrap operation performed on the fifth page PG5 included in the k+1-th physical word line WLk+1 is completed, a second program step may be performed on the adjacent first page PG1 included in the k-th physical word line WLk for a time tf5.

When the second program step performed on the first page PG1 included in the k-th physical word line WLk is completed, a first program step may be performed on the adjacent second page PG2 included in the k-th physical word line WLk for a time tf6. The memory device 100 may perform a detrap operation on the second page PG2 for a time tf7.

When the detrap operation performed on the second page PG2 is completed, the memory device 100 may perform a second program step on the fifth page PG5 included in the k+1-th physical word line WLk+1 for a time tf8.

When the second program step performed on the fifth page PG5 is completed, the memory device 100 may perform a first program step on the adjacent sixth page PG6 for a time tf9. The memory device 100 may perform a detrap operation on the sixth page PG6 for a time tf10. Although not shown, after the detrap operation for the sixth page PG6, a second program step may be performed in turn for the second page PG2 and the sixth page PG6.

Figure 23:
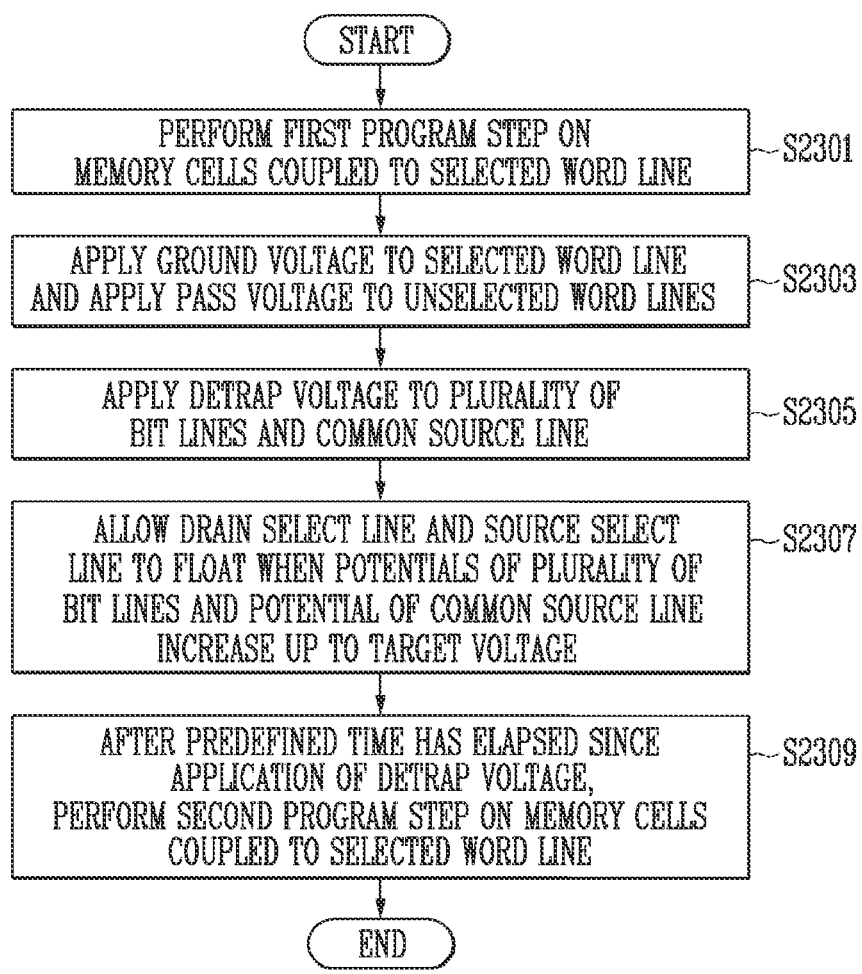
FIG. 23 is a flowchart illustrating an example program operation according to an embodiment.

FIG. 23 is a flowchart illustrating an example program operation according to an embodiment.

At step S2301, the memory device 100 may perform a first program step on memory cells coupled to a selected word line in response to a program command from a memory controller 200.

At step S2303, the memory device 100 may apply a ground voltage to the selected word line and apply a pass voltage to unselected word lines.

At step S2305, the memory device 100 may apply a detrap voltage to a plurality of bit lines and a common source line.

At step S2307, the memory device 100 may allow the drain select line and the source select line to float at a time point at which the potentials of the plurality of bit lines and the potential of the common source line reach a target voltage. The target voltage may be denoted by, for example, V1 in FIGS. 14, 16, and 18.

At step S2309, the memory device 100 may perform a second program step on the memory cells coupled to the selected word line after a period of time has elapsed since the application of the detrap voltage. In some embodiments, the period of time may be, for example, a predefined period.

In other embodiments, the period of time may be a delay that may be variable within a range. For example, the delay may be random or pseudo random period within a range. The period may be determined by, for example, a random number generator. The word "predefined" as used herein with respect to a parameter, such as a predefined time or predefined magnitude, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm. The word "preset" as used herein with respect to a parameter, such as a preset page, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 24:
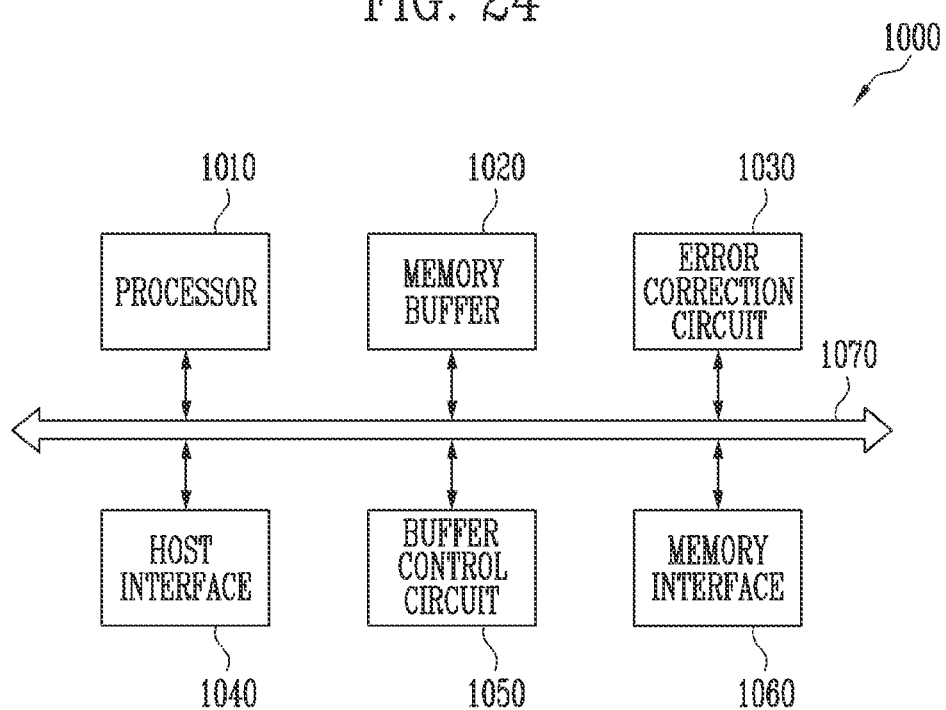
FIG. 24 is a diagram illustrating an example embodiment of a memory controller of FIG. 1.

FIG. 24 is a diagram illustrating an example embodiment of the memory controller of FIG. 1.

Referring to FIG. 24, a memory controller 1000 is coupled to a host (not shown) and, for example, a memory device 100. The memory controller 1000 may be similar to the memory controller 200. Accordingly, an embodiment of the storage device 50 may include the memory controller 1000 and the memory device 100. In response to a request from the host (not shown), the memory controller 1000 may access the memory device 100. For example, the memory controller 1000 may control read, write, erase, and background operations of the memory device 100. A background operation may be, for example, a program operation for wear leveling, a program operation for garbage collection, etc. The memory controller 1000 may provide an interface between the memory device 100 and the host. The memory controller 1000 may run firmware/software for controlling the memory device 100.

The memory controller 1000 may include a processor 1010, a memory buffer 1020, an error correction circuit (ECC) 1030, a host interface 1040, a buffer control circuit 1050, a memory interface 1060, and a bus 1070.

The bus 1070 may provide a communication channel among components of the memory controller 1000.

The processor 1010 may be configured to execute code, such as, for example, firmware and/or software, to control the overall operation of the memory controller 1000 and perform logical operations. The processor 1010 may communicate with an external host through the host interface 1040 and also communicate with the memory device 100 through the memory interface 1060. Further, the processor 1010 may communicate with the memory buffer 1020 through the buffer control circuit 1050. The processor 1010 may control the operation of the storage device 50 by, for example, using the memory buffer 1020 as a working memory, a cache memory, and/or a buffer memory.

The processor 1010 may perform a function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device 100 and may be programmed in the memory cell array.

The processor 1010 may derandomize the data received from the memory device 100 during a read operation. For example, the processor 1010 may derandomize the data received from the memory device 100 using a derandomizing seed. Derandomized data may be output to the host.

In an embodiment, the processor 1010 may run software and/or firmware to perform the randomizing or derandomizing operation.

The memory buffer 1020 may be used as a working memory, a cache memory, or a buffer memory of the processor 1010. The memory buffer 1020 may store codes and commands that are executed by the processor 1010. The memory buffer 1020 may store data that is processed by the processor 1010. The memory buffer 1020 may include a static RAM (SRAM) or a dynamic RAM (DRAM).

The error correction circuit 1030 may perform error correction. The error correction circuit 1030 may perform error correction code (ECC) encoding based on data to be written to the memory device 100 through the memory interface 1060. The ECC-encoded data may be transferred to the memory device 100 through the memory interface 1060. The error correction circuit 1030 may perform ECC decoding based on data received from the memory device 100 through the memory interface 1060. In an example, the error correction circuit 1030 may be included, as the component of the memory interface 1060, in the memory interface 1060.

The host interface 1040 may communicate with the external host under the control of the processor 1010. The host interface 1040 may perform communication using at least one of various communication methods such as, for example, Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), Load Reduced DIMM (LRDIMM) communication methods, etc.

The buffer control circuit 1050 may control the memory buffer 1020 under the control of the processor 1010.

The memory interface 1060 may communicate with the memory device 100 under the control of the processor 1010. The memory interface 1060 may transmit/receive commands, addresses, and data to/from the memory device 100 through channels.

In an embodiment, the memory controller 1000 may not include the memory buffer 1020 and the buffer control circuit 1050.

In an embodiment, the processor 1010 may control the operation of the memory controller 1000 using executable code such as firmware and/or software. The processor 1010 may load at least a portion of the code from a nonvolatile memory device (e.g., ROM) provided in the memory controller 1000. In an embodiment, the processor 1010 may load at least a portion of the code from the memory device 100 through the memory interface 1060.

In an embodiment, the bus 1070 of the memory controller 1000 may comprise a control bus and a data bus. The data bus may transmit data in the memory controller 1000, and the control bus may transmit control information, such as commands, addresses, etc., in the memory controller 1000. In an embodiment, the data bus and the control bus may be separated from each other, and may neither interfere with each other nor influence each other. The data bus may be coupled to, for example, the host interface 1040, the buffer control circuit 1050, the error correction circuit 1030, and the memory interface 1060. The control bus may be coupled to, for example, the host interface 1040, the processor 1010, the buffer control circuit 1050, the memory buffer 1020, and the memory interface 1060.

Figure 25:
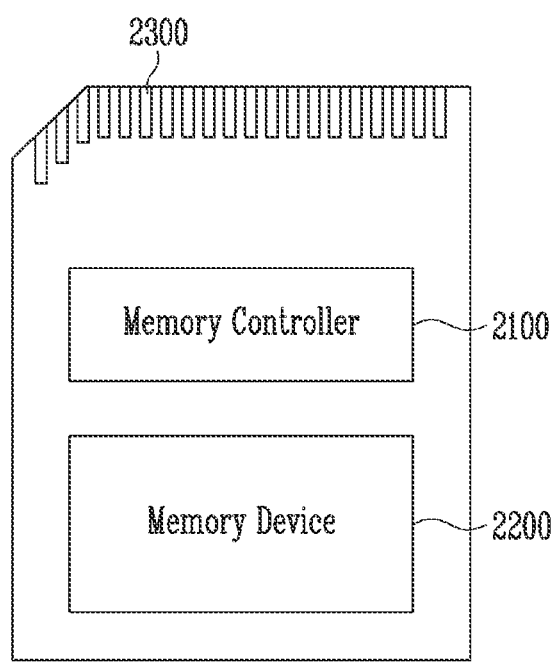
FIG. 25 is a block diagram illustrating an example memory card system to which a storage device according to an embodiment of the present disclosure is applied.

FIG. 25 is a block diagram illustrating an example memory card system to which a storage device according to an embodiment of the present disclosure is applied.

Referring to FIG. 25, a memory card system 2000 may include a memory controller 2100, a memory device 2200, and a connector 2300.

The memory controller 2100 is coupled to the memory device 2200 and may access the memory device 2200. For example, the memory controller 2100 may control read, write, erase, and background operations of the memory device 2200. The memory controller 2100 may provide an interface between the memory device 2200 and a host. The memory controller 2100 may run firmware/software for controlling the memory device 2200. The memory controller 2100 may be implemented in the same manner as the memory controller 200 or the memory controller 1000, described above with reference to FIGS. 1 and 24, respectively.

In an embodiment, the memory controller 2100 may include components, such as a RAM, a processor, a host interface, a memory interface, and an error correction circuit.

The memory controller 2100 may communicate with an external device through the connector 2300. The memory controller 2100 may communicate with an external device (e.g., a host, not shown) based on a specific communication protocol. In an embodiment, the memory controller 2100 may communicate with the external device through at least one of various interface protocols for such as, for example, universal serial bus (USB), multimedia card (MMC), embedded MMC (EMMC), peripheral component interconnection (PCI), PCI-express (PCI-E), an advanced technology attachment (ATA) protocol, a serial-ATA (SATA), parallel-ATA (PATA), small computer system interface (SCSI), enhanced small disk interface (ESDI), integrated drive electronics (IDE), FIREWIRE, universal flash storage (UFS), WI-FI, BLUETOOTH, nonvolatile memory express (NVME), etc. In an embodiment, the connector 2300 may be defined by at least one of the above-described various communication protocols.

In an embodiment, the memory device 2200 may be implemented as any of various nonvolatile memory devices, such as, for example, an Electrically Erasable and Programmable ROM (EEPROM), a NAND flash memory, a NOR flash memory, a phase-change RAM (PRAM), a resistive RAM (ReRAM), a ferroelectric RAM (FRAM), a spin transfer torque magnetic RAM (STT-MRAM), etc.

The memory controller 2100 and the memory device 2200 may be integrated into a single semiconductor device to form a memory card. For example, the memory controller 2100 and the memory device 2200 may be integrated into a single semiconductor device and may then form a memory card such as, for example, a personal computer memory card international association (PCMCIA), a compact flash card (CF), a smart media card (SM or SMC), a memory stick multimedia card (MMC, RS-MMC, MMCmicro or eMMC), a SD card (SD, miniSD, microSD, or SDHC), a universal flash storage (UFS), or the like.

Figure 26:
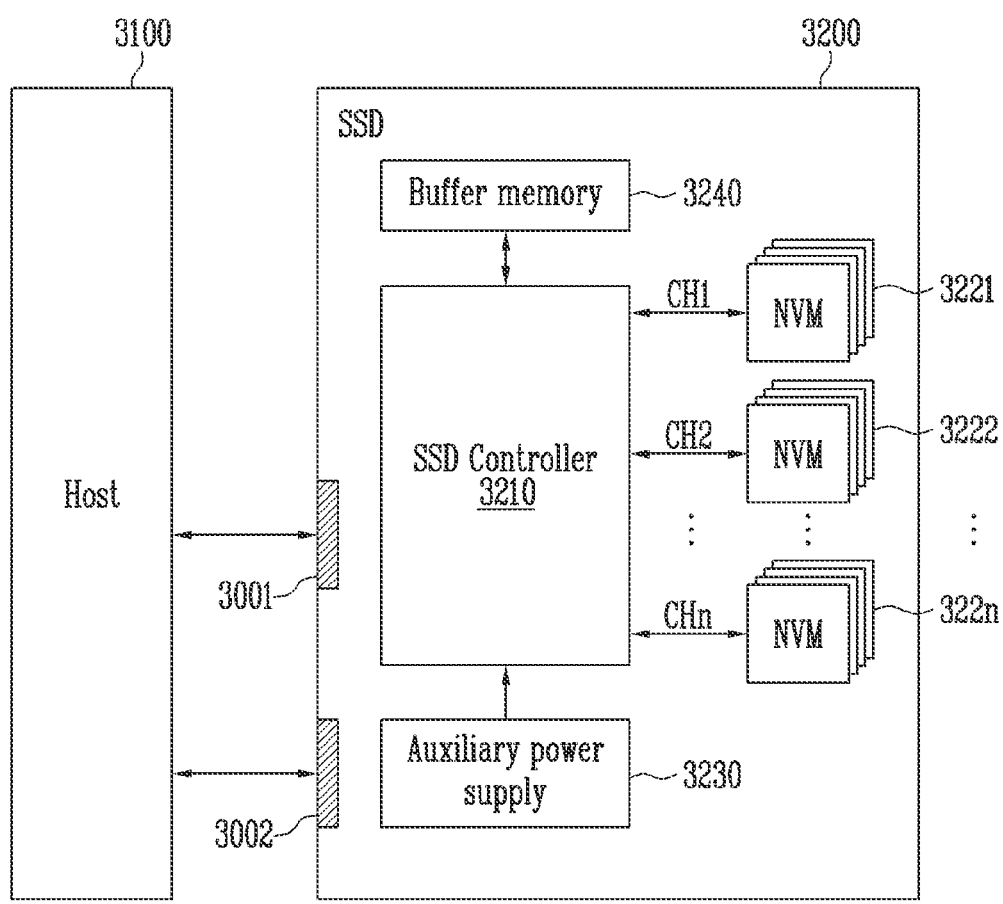
FIG. 26 is a block diagram illustrating an example solid state drive (SSD) system to which a storage device according to an embodiment of the present disclosure is applied.

FIG. 26 is a block diagram illustrating an example solid state drive (SSD) system to which a storage device according to an embodiment of the present disclosure is applied.

Referring to FIG. 26, an SSD system 3000 may include a host 3100 and an SSD 3200. The SSD 3200 may exchange a signal with the host 3100 through a signal connector 3001, and may receive power PWR through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may perform the function of previously described memory controller 200, memory controller 1000, or memory controller 2100.

The SSD controller 3210 may control the plurality of flash memories 3221 to 322n in response to the signal received from the host 3100. In an embodiment, the signal may indicate signals based on the interfaces of the host 3100 and the SSD 3200. For example, the signal may be a signal defined by at least one of various interfaces such as, for example, universal serial bus (USB), multimedia card (MMC), embedded MMC (EMMC), peripheral component interconnection (PCI), PCI-express (PCI-E), an advanced technology attachment (ATA), serial-ATA (SATA), parallel-ATA (PATA), small computer system interface (SCSI), enhanced small disk interface (ESDI), integrated drive electronics (IDE), FIREWIRE, universal flash storage (UFS), WI-FI, BLUETOOTH, nonvolatile memory express (NVME) interfaces, etc.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when, for example, the supply of power from the host 3100 is degraded below a performance threshold. The degradation may be, for example, voltage levels lesser or greater than a nominal voltage by a first predetermined percentage, current levels lesser or greater than a nominal value by a second predetermined percentage, power interruption for a predetermined amount of time, etc. In an embodiment, the auxiliary power supply 3230 may be located inside the SSD 3200 or located outside the SSD 3200. For example, the auxiliary power supply 3230 may be located in a main board, and may also provide auxiliary power to the SSD 3200.

The buffer memory 3240 functions as a buffer memory of the SSD 3200. For example, the buffer memory 3240 may store data received from the host 3100 or data received from the plurality of flash memories 3221 to 322n, or may store metadata (e.g., mapping tables) of the flash memories 3221 to 322n. The buffer memory 3240 may include volatile memories, such as DRAM, SDRAM, DDR SDRAM, LPDDR SDRAM, and GRAM, or nonvolatile memories, such as FRAM, ReRAM, STT-MRAM, and PRAM. The buffer memory 3240 with nonvolatile memory may temporarily store the data/metadata. That is, the buffer memory 3240 may, after, for example, a threshold amount of time, erase the data/metadata. Erasing may include, for example, marking the data/metadata as invalid so the memory space the data/metadata occupy can be written to. The data/metadata may also be erased after certain actions such as, for example, write of data stored in the buffer memory 3240, a read of data stored in the buffer memory 3240 by an external device, or a command to erase the data.

Figure 27:
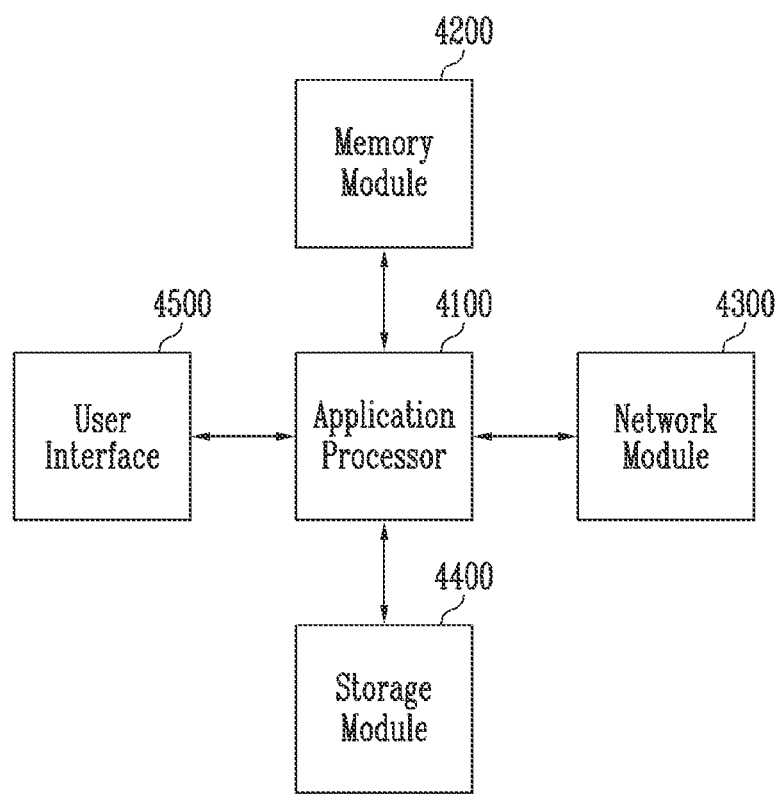
FIG. 27 is a block diagram illustrating an example user system to which a storage device according to an embodiment of the present disclosure is applied.

FIG. 27 is a block diagram illustrating an example user system to which a storage device according to an embodiment of the present disclosure is applied.

Referring to FIG. 27, a user system 4000 may include an application processor 4100, a memory module 4200, a network module 4300, a storage module 4400, and a user interface 4500.

The application processor 4100 may run components included in the user system 4000, an Operating System (OS), or a user program. In an embodiment, the application processor 4100 may include controllers, interfaces, graphic engines, etc. for controlling the components included in the user system 4000. The application processor 4100 may be formed of a system-on-chip (SoC).

The memory module 4200 may act as a main memory, a working memory, a buffer memory, or a cache memory of the user system 4000. The memory module 4200 may include volatile RAMs such as, for example, DRAM, SDRAM, DDR SDRAM, DDR2 SDRAM, DDR3 SDRAM, LPDDR SDARM, LPDDR2 SDRAM, LPDDR3 SDRAM, etc., or nonvolatile RAMs such as, for example, PRAM, ReRAM, MRAM, FRAM, etc. In an embodiment, the application processor 4100 and the memory module 4200 may be packaged based on a package-on-package (POP), and may then be provided as a single semiconductor package.

The network module 4300 may communicate with external devices. In an embodiment, the network module 4300 may support wireless communication, such as, for example, Code Division Multiple Access (CDMA), Global System for Mobile communication (GSM), wideband CDMA (WCDMA), CDMA-2000, Time Division Multiple Access (TDMA), Long Term Evolution (LTE), WIMAX, WLAN, UWB, Bluetooth, WI-FI, etc. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as, for example, a Phase-change RAM (PRAM), a Magnetic RAM (MRAM), a Resistive RAM (RRAM), a NAND flash memory, a NOR flash memory, a NAND flash memory having a three-dimensional (3D) structure, etc. In an embodiment, the storage module 4400 may be provided as a removable storage medium (removable drive), such as, for example, a memory card, an external drive of the user system 4000, etc.

In an embodiment, the storage module 4400 may include a plurality of nonvolatile memory devices, each of which may operate in the same manner as the memory device 100, described above with reference to FIG. 1. The storage module 4400 may operate in the same manner as the storage device 50, described above with reference to FIG. 1.

The user interface 4500 may include interfaces which input data or instructions to the application processor 4100 or output data to an external device. In an embodiment, the user interface 4500 may include user input interfaces such as, for example, a keyboard, a keypad, a button, a touch panel, a touch screen, a touch pad, a touch ball, a camera, a microphone, a gyroscope sensor, a vibration sensor, a piezoelectric element, etc. The user interface 4500 may further include user output interfaces such as, for example, a Liquid Crystal Display (LCD), an Organic Light Emitting Diode (OLED) display device, an Active Matrix OLED (AMO-LED) display device, an LED, a speaker, a monitor, etc.

In accordance with the present disclosure, there are provided some embodiments of a memory device that reduce the time required for a program operation and allow threshold voltage distributions of memory cells after the program operation has been completed to be improved. However, the disclosure need not be limited to these embodiments. Various other embodiments, including variations and/or combinations of the disclosed embodiments, may be possible to a person of ordinary skill in the art.

What is claimed is:

1. A memory device, comprising:
   a plurality of memory cells coupled to a plurality of bit lines and a common source line, the plurality of memory cells forming a plurality of strings respectively coupled to the plurality of bit lines and coupled in common to the common source line, each string including a drain select transistor, a portion of the plurality of memory cells, and a source select transistor that are coupled in series to each other; and
   a control circuit configured to control a peripheral circuit to perform a program operation that includes two or more program steps on selected memory cells of a selected word line, among word lines,
   wherein the peripheral circuit is configured to:
   perform a first program step of the two or more program steps on the selected memory cells;
   perform a detrap operation that applies a detrap voltage to the plurality of bit lines and the common source line for a predefined time, and controls a drain select line coupled to the drain select transistor and a source select line coupled to the source select transistor to float; and
   perform a second program step of the two or more program steps on the selected memory cells.

2. The memory device according to claim 1, wherein:
   at least one of the first program step and the second program step comprises a plurality of program loops, and
   each of the plurality of program loops comprises a program voltage apply step of applying a program voltage increased by a step voltage to the selected word line as a number of program loops increases, and a verify step of verifying whether the program operation on the selected memory cells has been completed.

3. The memory device according to claim 2, wherein:
   the first program step is a foggy program operation of programming the memory cells coupled to the selected word line such that each of the memory cells has a threshold voltage corresponding to any one of intermediate states respectively corresponding to a plurality of states, and
   the second program step is a fine program operation of programming memory cells having threshold voltages included in the intermediate states such that each of the memory cells has a threshold voltage corresponding to any one of the plurality of states.

4. The memory device according to claim 1, wherein the control circuit is configured to control the peripheral circuit during the detrap operation, wherein the peripheral circuit is further configured to:
   apply a ground voltage to the selected word line;
   apply a pass voltage having a predefined magnitude to unselected word lines other than the selected word line, among the word lines; and
   control the drain select line and the source select line to float when potentials of the plurality of bit lines and a potential of the common source line increase up to a target voltage after the detrap voltage is applied.

5. The memory device according to claim 4, wherein the target voltage has a magnitude equal to a magnitude of a minimum voltage for forming hot holes in a channel area of the selected memory cells through the detrap voltage applied to the plurality of bit lines and the common source line.

6. The memory device according to claim 1, wherein:
the word lines include programmed word lines coupled to memory cells for which a program operation is completed, unprogrammed word lines coupled to memory cells before a program operation is performed, and the selected word line, and
the control circuit is configured to control the peripheral circuit during the detrap operation, wherein the peripheral circuit is further configured to:
apply a pass voltage having a predefined magnitude to the programmed word lines, apply a first voltage less than the pass voltage to the unprogrammed word lines, and apply a second voltage less than the pass voltage and greater than the first voltage to the selected word line, and
when potentials of the plurality of bit lines and a potential of the common source line increase up to a target voltage after the detrap voltage is applied, control the drain select line and the source select line to float.

7. The memory device according to claim 6, wherein:
the first voltage is a ground voltage, and
a difference between a magnitude of the detrap voltage and a magnitude of the second voltage is equal to or greater than a minimum voltage for detrapping electrons trapped in the selected memory cells.

8. The memory device according to claim 1, wherein the control circuit is configured to control the peripheral circuit to:
perform the first program step and the detrap operation on the selected memory cells,
thereafter perform the first program step and the detrap operation on memory cells coupled to a word line that is adjacent to the selected word line, and
after the first program step and the detrap operation are completed on the memory cells coupled to the word line that is adjacent to the selected word line, perform the second program step on the selected word line.

9. The memory device according to claim 8, wherein the control circuit controls the peripheral circuit to, after the second program step has been completed on the selected memory cells, perform the second program step on the memory cells coupled to the word line that is adjacent to the selected word line.

10. A memory device, comprising:
a plurality of memory cells coupled to a plurality of word lines, each word line including a plurality of pages, the plurality of memory cells being coupled to a plurality of bit lines and a common source line, the plurality of memory cells forming a plurality of string groups coupled to the plurality of bit lines and the common source line and respectively corresponding to the plurality of pages, wherein each of a plurality of strings included in each of the plurality of string groups includes a drain select transistor, a portion of the plurality of memory cells, and a source select transistor; and
a control circuit configured to control a peripheral circuit to perform a program operation of two or more program steps on a page selected from among the plurality of pages included in a selected word line among the plurality of word lines,
wherein the peripheral circuit is configured to:
perform a first program step of the two or more program steps;
perform a detrap operation that applies a detrap voltage to the plurality of bit lines and the common source line for a predefined time, and controls drain select lines and source select lines to float, wherein the drain select lines and the source select lines are respectively coupled to drain select transistors and source select transistors that are included in strings corresponding to the selected page; and
thereafter perform a second program step of the two or more program steps on the selected page.

11. The memory device according to claim 10, wherein:
each of the first program step and the second program step comprises a plurality of program loops, and
each of the plurality of program loops comprises a program voltage apply step of applying a program voltage increased by a step voltage to the selected word line as a number of program loops increases, and a verify step of verifying whether the program operation on memory cells included in the selected page has been completed.

12. The memory device according to claim 11, wherein:
the first program step is a foggy program operation of programming memory cells included in the selected page such that each of the memory cells has a threshold voltage corresponding to any one of intermediate states respectively corresponding to a plurality of states, and
the second program step is a fine program operation of programming memory cells having threshold voltages included in the intermediate states such that each of the memory cells has a threshold voltage corresponding to any one of the plurality of states.

13. The memory device according to claim 10, wherein the control circuit is configured to control the peripheral circuit during the detrap operation, wherein the peripheral circuit is further configured to:
apply a ground voltage to the selected word line and apply a pass voltage having a predefined magnitude to unselected word lines other than the selected word line, among the plurality of word lines, and
when potentials of the plurality of bit lines and a potential of the common source line increase up to a target voltage after the detrap voltage is applied, control the drain select lines and the source select lines to float.

14. The memory device according to claim 13, wherein the control circuit is further configured to control the peripheral circuit to allow a drain select line and a source select line to float when the detrap voltage is applied, wherein the drain select line and the source select line are respectively coupled to drain select transistors and source select transistors included in strings corresponding to pages other than the selected page, among the plurality of pages included in the selected word line.

15. The memory device according to claim 13, wherein the target voltage has a magnitude equal to a magnitude of a minimum voltage for forming hot holes in a channel area of memory cells included in the selected page through the detrap voltage applied to the plurality of bit lines and the common source line.

16. The memory device according to claim 10, wherein the detrap voltage has a magnitude equal to or greater than a magnitude of a minimum voltage for detrapping electrons trapped in memory cells included in the selected page.

17. The memory device according to claim 10, wherein the control circuit is configured to control the peripheral circuit to:
  perform the first program step on each of the plurality of pages included in the selected word line,
  after the first program step has been completed on each of the plurality of pages included in the selected word line, perform the detrap operation on the plurality of pages included in the selected word line, and
  after the detrap operation has been completed on the plurality of pages included in the selected word line, perform the second program step on each of the plurality of pages included in the selected word line.

18. The memory device according to claim 10, wherein the control circuit is configured to control the peripheral circuit to, after the first program step, the detrap operation, and the second program step on the selected page have been completed, sequentially perform the first program step, the detrap operation, and the second program step on an adjacent page that is coupled to the selected word line and is adjacent to the selected page.

19. The memory device according to claim 10, wherein the control circuit is configured to control the peripheral circuit to:
  after the first program step and the detrap operation have been completed on the selected page, perform the first program step and the detrap operation on a page preset to be selected first, among a plurality of pages included in an adjacent word line that is a word line adjacent to the selected word line and to be selected subsequent to the selected word line, and
  after the first program step and the detrap operation have been completed on the page preset to be selected first, perform the second program step on the selected page.

20. A method of operating a memory device, the memory device including a plurality of memory cells coupled to a plurality of word lines and coupled between a plurality of bit lines and a common source line, the plurality of memory cells forming a plurality of strings respectively coupled to the plurality of bit lines and coupled in common to the common source line, each string including a drain select transistor, a portion of the plurality of memory cells, and a source select transistor that are coupled in series to each other, the method comprising:
  performing a first program step on selected memory cells coupled to a corresponding word line selected from among the plurality of word lines;
  after the first program step has been completed, performing a detrap operation that applies a detrap voltage to the plurality of bit lines and the common source line for a predefined time and floats a drain select line coupled to the drain select transistor and a source select line coupled to the source select transistor wherein the detrap voltage is used to detrap at least one electron trapped in the selected memory cells; and
  after the detrap operation has been completed, performing a second program step on the selected memory cells.

* * * * *